US012641979B2

(12) United States Patent
Yu et al.

(10) Patent No.: US 12,641,979 B2
(45) Date of Patent: May 26, 2026

(54) DISPLAY SUBSTRATE AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Chi Yu, Beijing (CN); Benlian Wang, Beijing (CN); Hongli Wang, Beijing (CN); Weiyun Huang, Beijing (CN); Ming Hu, Beijing (CN); Youngyik Ko, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 392 days.

(21) Appl. No.: 18/263,184

(22) PCT Filed: Aug. 10, 2022

(86) PCT No.: PCT/CN2022/111399
§ 371 (c)(1),
(2) Date: Jul. 27, 2023

(87) PCT Pub. No.: WO2023/024901
PCT Pub. Date: Mar. 2, 2023

(65) Prior Publication Data
US 2024/0090294 A1 Mar. 14, 2024

(30) Foreign Application Priority Data

Aug. 23, 2021 (CN) .......................... 202110971715.1
Sep. 30, 2021 (CN) .......................... 202111168170.7

(51) Int. Cl.
H10K 59/35 (2023.01)
H10K 59/122 (2023.01)
(Continued)

(52) U.S. Cl.
CPC ......... *H10K 59/353* (2023.02); *H10K 59/122* (2023.02); *H10K 59/131* (2023.02); *H10K 59/352* (2023.02); *H10K 59/65* (2023.02)

(58) Field of Classification Search
CPC .......................... H10K 59/352; H10K 59/353
(Continued)

(56) References Cited

U.S. PATENT DOCUMENTS 9,711,585 B2 7/2017 Kim et al.
10,453,901 B2 10/2019 Kim et al.
(Continued)

FOREIGN PATENT DOCUMENTS

CN 105938704 A 9/2016
CN 108010946 A 5/2018
(Continued)

OTHER PUBLICATIONS

Application and Drawings for U.S. Appl. No. 18/260,684, filed Jul. 7, 2023, entitled "Display Substrate and Display Device", 96 pages.
(Continued)

*Primary Examiner* — Christopher M Raabe
(74) *Attorney, Agent, or Firm* — Westman, Champlin & Koehler, P.A.

(57) ABSTRACT

A display substrate and a display device, the display substrate includes a first display region, and the display substrate includes first pixel structures in the first display region, the first pixel structure includes two first sub-pixels and two second sub-pixels, the first sub-pixel includes a first opening, and the second sub-pixel includes a second opening. In the first pixel structure, patterns of orthographic projections
(Continued)

of the first openings of the two first sub-pixels on the base substrate have a first center and a third center, respectively, patterns of orthographic projections of the second openings of the two second sub-pixels on the base substrate have a second center and a fourth center, respectively, the first center, the second center, the third center and the fourth center are connected in sequence to form a first quadrilateral, and at least two sides of the first quadrilateral have lengths not equal to each other.

20 Claims, 19 Drawing Sheets

(51) Int. Cl.
  *H10K 59/131*         (2023.01)
  *H10K 59/65*          (2023.01)
(58) Field of Classification Search
  USPC ................................................. 313/498–512
  See application file for complete search history.

(56)                References Cited

U.S. PATENT DOCUMENTS

| | | | |
|---|---|---|---|
| 10,546,904 | B2 | 1/2020 | Hou |
| 10,686,018 | B2 | 6/2020 | Kim et al. |
| 11,335,748 | B2 | 5/2022 | Zhang et al. |
| 11,515,362 | B2 | 11/2022 | Yang |
| 11,587,999 | B2 | 2/2023 | Bok et al. |
| 11,723,242 | B2 | 8/2023 | Park et al. |
| 11,765,943 | B2 | 9/2023 | Yang et al. |
| 11,812,648 | B2 | 11/2023 | Hu et al. |
| 11,874,999 | B2 | 1/2024 | Peng |
| 2014/0306198 | A1 | 10/2014 | Im et al. |
| 2016/0260792 | A1 | 9/2016 | Kim et al. |
| 2019/0033995 | A1 | 1/2019 | Teramoto |
| 2019/0074329 | A1 | 3/2019 | Kim et al. |
| 2019/0165059 | A1 | 5/2019 | Hou |
| 2019/0386078 | A1 | 12/2019 | An et al. |
| 2019/0393275 | A1 | 12/2019 | Kim et al. |
| 2020/0043990 | A1 | 2/2020 | Huangfu et al. |
| 2020/0211443 | A1 | 7/2020 | Zeng et al. |
| 2020/0212269 | A1 | 7/2020 | Akimoto |
| 2020/0227488 | A1 | 7/2020 | Xin et al. |
| 2020/0394955 | A1 | 12/2020 | Lee |
| 2020/0403048 | A1 | 12/2020 | Zhang et al. |
| 2021/0020664 | A1 | 1/2021 | Tan |
| 2021/0050388 | A1 | 2/2021 | Song |
| 2021/0050389 | A1 | 2/2021 | Yang |
| 2021/0091145 | A1* | 3/2021 | Huangfu ........... G02F 1/133514 |
| 2021/0183984 | A1 | 6/2021 | Park et al. |
| 2021/0184155 | A1 | 6/2021 | Chae et al. |
| 2021/0193769 | A1 | 6/2021 | Bok et al. |
| 2021/0202900 | A1 | 7/2021 | Lee |
| 2021/0265396 | A1 | 8/2021 | Kim et al. |
| 2021/0391396 | A1 | 12/2021 | Yang et al. |
| 2022/0028317 | A1 | 1/2022 | Kim |
| 2022/0069031 | A1* | 3/2022 | Yue ..................... H10K 59/352 |
| 2022/0157895 | A1 | 5/2022 | Xu et al. |
| 2022/0199028 | A1 | 6/2022 | Wang |
| 2022/0199710 | A1 | 6/2022 | Xu et al. |
| 2022/0310710 | A1 | 9/2022 | Hu et al. |
| 2022/0310711 | A1* | 9/2022 | Liu ..................... H10K 59/353 |
| 2022/0319421 | A1 | 10/2022 | Qiu |
| 2022/0328573 | A1 | 10/2022 | Hu et al. |
| 2022/0366848 | A1 | 11/2022 | Huang |
| 2023/0006005 | A1 | 1/2023 | Wang et al. |
| 2023/0053413 | A1 | 2/2023 | Liu |
| 2023/0087603 | A1 | 3/2023 | Wang et al. |
| 2023/0276676 | A1* | 8/2023 | Kim ..................... H10K 59/353 |
| | | | 257/88 |
| 2023/0329065 | A1 | 10/2023 | Chen et al. |
| 2023/0413605 | A1 | 12/2023 | Lou |
| 2024/0276824 | A1* | 8/2024 | Yue ..................... H10K 59/352 |
| 2024/0349534 | A1* | 10/2024 | Chen .................. H10K 59/1213 |
| 2025/0248218 | A1 | 7/2025 | Yang et al. |
| 2025/0275388 | A1 | 8/2025 | Ding et al. |

FOREIGN PATENT DOCUMENTS

| | | |
|---|---|---|
| CN | 108538884 A | 9/2018 |
| CN | 109427855 A | 3/2019 |
| CN | 109686778 A | 4/2019 |
| CN | 110137206 A | 8/2019 |
| CN | 110767699 A | 2/2020 |
| CN | 111028692 A | 4/2020 |
| CN | 111048005 A | 4/2020 |
| CN | 111223908 A | 6/2020 |
| CN | 111402743 A | 7/2020 |
| CN | 211150599 U | 7/2020 |
| CN | 111834425 A | 10/2020 |
| CN | 111969027 A | 11/2020 |
| CN | 112002748 A | 11/2020 |
| CN | 112018147 A | 12/2020 |
| CN | 112133732 A | 12/2020 |
| CN | 112313802 A | 2/2021 |
| CN | 112368840 A | 2/2021 |
| CN | 112397547 A | 2/2021 |
| CN | 112562518 A | 3/2021 |
| CN | 112585761 A | 3/2021 |
| CN | 112864215 A | 5/2021 |
| CN | 112928147 A | 6/2021 |
| CN | 112951878 A | 6/2021 |
| CN | 112992969 A | 6/2021 |
| CN | 113013201 A | 6/2021 |
| CN | 113056828 A | 6/2021 |
| CN | 113178163 A | 7/2021 |
| CN | 113196494 A | 7/2021 |
| CN | 113284928 A | 8/2021 |
| CN | 113327972 A | 8/2021 |
| CN | 113674689 A | 11/2021 |
| CN | 217134376 U | 8/2022 |
| CN | 217933802 U | 11/2022 |
| WO | 2017140038 A1 | 8/2017 |
| WO | 2020001087 A1 | 1/2020 |
| WO | 2020133885 A1 | 7/2020 |
| WO | 2021018310 A1 | 2/2021 |

OTHER PUBLICATIONS

Translation of Chinese Office Action issued Apr. 30, 2025 from CNIPA for Chinese Patent Application No. 202210531683.8, 31 pages.
Translation of Chinese Office Action issued Jul. 16, 2025 from CNIPA for Chinese Patent Application No. 202111168170.7, 26 pages.
Notice of Allowance issued in corresponding U.S. Appl. No. 18/005,770, dated May 15, 2025, 21 pages.
Translation of Indian Office Action for Indian Patent Application No. 202327055180, dated Nov. 12, 2025, 7 pages.
US Office Action for U.S. Appl. No. 18/260,684, dated Sep. 22, 2025, 22 pages.

* cited by examiner

DISPLAY SUBSTRATE AND DISPLAY DEVICE

CROSS REFERENCE TO RELATED APPLICATION(S)

This application is a Section 371 National Stage Application of International Application No. PCT/CN2022/111399, filed on Aug. 10, 2022, entitled "DISPLAY SUBSTRATE AND DISPLAY DEVICE", which published as WIPO Publication No. 2023/024901 A1, on Mar. 2, 2023, not in English, which claims priority to Chinese Patent Application No. 202110971715.1, filed on Aug. 23, 2021, and Chinese Patent Application No. 202111168170.7, filed on Sep. 30, 2021, the contents of which are incorporated herein by reference in their entireties.

TECHNICAL FIELD

The present disclosure relates to a field of a display technology, and in particular, to a display substrate and a display device.

BACKGROUND

With an increasing demand for a diversified use of a display device and an emergence of a design requirement for a high screen-to-body ratio of the display device, a solution of "under-screen camera" has emerged. In the solution of "under-screen camera", an imaging module such as a camera may be embedded in a display region to reduce a size of a bezel region of the display device, so that the screen-to-body ratio may be increased. At present, in the solution of "under-screen camera", how to ensure a light transmittance and a display effect of a portion of a display substrate corresponding to a position where the imaging module is provided on the basis of increasing the screen-to-body ratio of the display device has become an important subject of concern to R&D personnel.

The above information disclosed in this section is just for the understanding of the background of technical concepts of the present disclosure. Therefore, the above information may contain information that does not constitute a related art.

SUMMARY

In an aspect, a display substrate is provided, the display substrate includes a first display region, and the display substrate includes:

a base substrate;

a first pixel structure in the first display region, wherein the first pixel structure includes two first sub-pixels and two second sub-pixels; and a pixel defining layer on the base substrate, wherein the pixel defining layer includes a first opening and a second opening in the first display region, wherein the first sub-pixel includes the first opening, and the second sub-pixel includes the second opening, and wherein in the first pixel structure, patterns of orthographic projections of the first openings of the two first sub-pixels on the base substrate have a first center and a third center, respectively, patterns of orthographic projections of the second openings of the two second sub-pixels on the base substrate have a second center and a fourth center, respectively, and the first center, the second center, the third center and the fourth center are connected in sequence to form a first quadrilateral, at least two sides of the first quadrilateral have lengths not equal to each other, and a ratio of a length of one of the at least two sides to a length of another of the at least two sides ranges from 0.8 to 1.2.

According to some exemplary embodiments, the first pixel structure further includes a third sub-pixel, and at least one third sub-pixel is located inside the first quadrilateral.

According to some exemplary embodiments, the first pixel structure further includes a plurality of third sub-pixels arranged in an array in a first direction and a second direction, the pixel defining layer further includes a plurality of third openings in the first display region, and the third sub-pixel includes the third opening, and the third opening of at least one third sub-pixel is located within the first quadrilateral, a projection of the third opening of the third sub-pixel in the first direction does not overlap with each of a projection of the first opening of the first sub-pixel in the first direction and a projection of the second opening of the second sub-pixel in the first direction, and a projection of the third opening of the third sub-pixel in the second direction does not overlap with each of a projection of the first opening of the first sub-pixel in the second direction and a projection of the second opening of the second sub-pixel in the second direction.

According to some exemplary embodiments, in the first pixel structure, the first sub-pixels and the second sub-pixels are adjacent to each other in both the first direction and the second direction, and a distance in the first direction between a center of a first opening of a first sub-pixel and a center of a second opening of a second sub-pixel adjacent to the first sub-pixel in the first direction is not equal to a distance in the second direction between a center of a first opening of a first sub-pixel and a center of a second opening of a second sub-pixel adjacent to the first sub-pixel in the second direction.

According to some exemplary embodiments, in the first pixel structure, the first sub-pixels and the second sub-pixels are adjacent to each other in both the first direction and the second direction, and a minimum distance in the first direction between a boundary of a first opening of a first sub-pixel and a boundary of a second opening of a second sub-pixel adjacent to the first sub-pixel in the first direction is not equal to a minimum distance in the second direction between a boundary of a first opening of a first sub-pixel and a boundary of a second opening of a second sub-pixel adjacent to the first sub-pixel in the second direction.

According to some exemplary embodiments, an outline of the pattern of the orthographic projection of the first opening of the first sub-pixel on the base substrate and/or an outline of the pattern of the orthographic projection of the second opening of the second sub-pixel on the base substrate include/includes an arc, and the pattern of the orthographic projection of the first opening of the first sub-pixel on the base substrate and/or the pattern of the orthographic projection of the second opening of the second sub-pixel on the base substrate are/is axisymmetric in one of the first direction and the second direction, and are/is non-axisymmetric in the other of the first direction and the second direction.

According to some exemplary embodiments, an outline of the pattern of the orthographic projection of the first opening of the first sub-pixel on the base substrate and/or an outline of the pattern of the orthographic projection of the second opening of the second sub-pixel on the base substrate include/includes an arc portion and a non-arc portion, the arc portion has a same center of circle, and a total length of the non-arc portion is less than a total length of the arc portion.

According to some exemplary embodiments, the first opening of at least one first sub-pixel includes a body portion and an auxiliary portion, an orthographic projection of the body portion of the first opening on the base substrate is substantially a circle, and an orthographic projection of the auxiliary portion of the first opening on the base substrate protrudes in the first direction or in the second direction relative to the circle.

According to some exemplary embodiments, a pattern of the orthographic projection of the body portion of the first opening on the base substrate has a first center of circle, and for the first opening having the first center, the first center of the first opening is offset by a first offset distance in the first direction or the second direction relative to the first center of circle of the body portion of the first opening.

According to some exemplary embodiments, for the first opening having the third center, the third center of the first opening is offset by a second offset distance in the first direction or the second direction relative to the first center of circle of the body portion of the first opening.

According to some exemplary embodiments, a ratio of the first offset distance to the second offset distance ranges from 0.8 to 1.2.

According to some exemplary embodiments, the first offset distance and/or the second offset distance range/ ranges from 1 micron to 5 microns.

According to some exemplary embodiments, a line connecting the first center of circle of the first opening and the second center is substantially parallel to the first direction, a line connecting the first center and the second center forms a first angle with respect to the first direction, and the first angle is greater than or equal to 0° and less than or equal to 30°; and/or for the first opening having the third center, a line connecting the first center of circle of the first opening and the fourth center is substantially parallel to the first direction, a line connecting the third center and the fourth center forms a second angle with respect to the first direction, and the second angle is greater than or equal to 0° and less than or equal to 30°.

According to some exemplary embodiments, at least one first pixel structure further includes at least four third sub-pixels, the pixel defining layer includes a plurality of third openings in the first display region, and the third sub-pixel includes the third opening, and an orthographic projection of at least one third opening on the base substrate falls within the first quadrilateral and has a fifth center, and a separation distance between the fifth center and the second center in the second direction is not equal to a separation distance between the fifth center and the third center in the second direction.

According to some exemplary embodiments, the third opening of at least one third sub-pixel includes a body portion and an auxiliary portion, an orthographic projection of the body portion of the third opening on the base substrate is a circle, and an orthographic projection of the auxiliary portion of the third opening on the base substrate protrudes in the second direction relative to the circle of the body portion of the third opening.

According to some exemplary embodiments, in the first pixel structure, patterns of orthographic projections of the third openings of the four third sub-pixels on the base substrate have a fifth center, a sixth center, a seventh center and an eighth center, respectively, the fifth center, the sixth center, the seventh center and the eighth center are connected in sequence to form a second quadrilateral, and a ratio of a length of one of any two sides among four sides of the second quadrilateral to a length of the other of the two sides ranges from 0.8 to 1.2.

According to some exemplary embodiments, the display substrate further includes:

an anode structure on a side of the pixel defining layer facing the base substrate;

a pixel driving circuit between the base substrate and the anode structure; and an anode connection hole, wherein the anode structure is connected to the pixel driving circuit through the anode connection hole, wherein an orthographic projection of an auxiliary portion of the first opening on the base substrate protrudes, relative to a circle of a body portion of the first opening, toward an orthographic projection of the anode connection hole of the first sub-pixel where the first opening is located on the base substrate; and/or an orthographic projection of an auxiliary portion of the third opening on the base substrate protrudes, relative to the circle of the body portion of the third opening, toward an orthographic projection of the anode connection hole of the third sub-pixel where the third opening is located on the base substrate.

According to some exemplary embodiments, the auxiliary portion of the first opening has a first corner portion on a side facing the anode connection hole of the first sub-pixel; and/or the auxiliary portion of the third opening has a third corner portion on a side facing the anode connection hole of the third sub-pixel.

According to some exemplary embodiments, an orthographic projection of the body portion of the first opening on the base substrate includes a first arc, an orthographic projection of the first corner portion on the base substrate includes a first side and a second side, the first side and the second side are respectively connected to the first arc and tangent to the first arc at respective connecting points, and an angle formed between the first side and the second side ranges from 10° to 170°; and/or an orthographic projection of the body portion of the third opening on the base substrate includes a third arc, an orthographic projection of the third corner portion on the base substrate includes a first side and a second side, the first side of the third corner portion and the second side of the third corner portion are respectively connected to the third arc and tangent to the third arc at respective connecting points, and an angle formed between the first side of the third corner portion and the second side of the third corner portion ranges from 10° to 170°.

According to some exemplary embodiments, the first opening has a first outline with a first boundary portion, a distance between the first boundary portion and the first center of circle of the body portion of the first opening is greater than a distance between other parts of the first outline and the first center of circle of the body portion of the first opening, and a distance between the first boundary portion and a center of the anode connection hole of the first sub-pixel where the first opening is located is less than a distance between other parts of the first outline and the center of the anode connection hole of the first sub-pixel where the first opening is located; and/or the third opening has a third outline with a third boundary portion, a distance between the third boundary portion and a third center of circle of the body portion of the third opening is greater than a distance between other parts of the third outline and the third center of circle of the body portion of the third opening, and a distance between the third boundary portion and a center of the anode connection hole of the third sub-pixel where the third opening is located is less than a distance between other parts of the third outline and the center of the anode connection hole of the third sub-pixel where the third opening is located.

According to some exemplary embodiments, the display substrate includes a plurality of first pixel structures arranged on the base substrate in an array in a first direction and a second direction to form sub-pixel rows and sub-pixel columns; a line connecting the centers of the first openings of a plurality of first sub-pixels in a same sub-pixel row and the centers of the second openings of a plurality of second sub-pixels in the same sub-pixel row is a broken line including a plurality of line segments, at least one line segment forms a third angle with respect to the first direction, and the third angle is greater than 0° and less than or equal to 30°; and/or a line connecting the centers of the first openings of a plurality of first sub-pixels in a same sub-pixel column and the centers of the second openings of a plurality of second sub-pixels in the same sub-pixel column is a broken line including a plurality of line segments, at least one line segment forms a fourth angle with respect to the second direction, and the fourth angle is greater than 0° and less than or equal to 30°.

According to some exemplary embodiments, in the first pixel structure, at least two first corner portions have different orientations; and/or at least two third corner portions have different orientations.

According to some exemplary embodiments, the auxiliary portion of the first opening has a rounded corner portion on a side facing the anode connection hole of the first sub-pixel; and/or the auxiliary portion of the third opening has a rounded corner portion on a side facing the anode connection hole of the third sub-pixel.

According to some exemplary embodiments, a line connecting the first center and the fourth center is substantially parallel to the second direction; and/or a line connecting the second center and the third center is substantially parallel to the second direction.

According to some exemplary embodiments, in the first pixel structure, patterns of orthographic projections of the third openings of the four third sub-pixels on the base substrate have a fifth center, a sixth center, a seventh center and an eighth center, respectively, the fifth center, the sixth center, the seventh center and the eighth center are connected in sequence to form a second quadrilateral, at least two sides of the second quadrilateral have different lengths, and a ratio of a length of one of the at least two sides to a length of another of the at least two sides ranges from 0.8 to 1.2.

According to some exemplary embodiments, the first quadrilateral and/or the second quadrilateral are/is selected from a parallelogram and/or an isosceles trapezoid.

According to some exemplary embodiments, the pattern of the orthographic projection of at least one first opening on the base substrate has a first axis of symmetry substantially parallel to the second direction.

According to some exemplary embodiments, a pattern of an orthographic projection of at least one third opening on the base substrate has a third axis of symmetry deflected by a predetermined deflection angle relative to the second direction.

According to some exemplary embodiments, for two third openings adjacent in a first direction in the first pixel structure, a deflection direction of a third axis of symmetry of one third opening relative to a second direction is opposite to a deflection direction of a third axis of symmetry of the other third opening relative to the second direction; and/or
    for two third openings adjacent in a second direction in the first pixel structure, a deflection direction of a third axis of symmetry of one third opening relative to the second direction is opposite to a deflection direction of a third axis of symmetry of the other third opening relative to the second direction.

According to some exemplary embodiments, for two third openings adjacent in a first direction in the first pixel structure, the deflection angle of the third axis of symmetry of one third opening relative to the second direction is substantially equal to the deflection angle of the third axis of symmetry of the other third opening relative to the second direction; and/or
    for two third openings adjacent in the second direction in the first pixel structure, the deflection angle of the third axis of symmetry of one third opening relative to the second direction is substantially equal to the deflection angle of the third axis of symmetry of the other third opening relative to the second direction.

According to some exemplary embodiments, the first opening of at least one first sub-pixel includes a body portion and an auxiliary portion, an orthographic projection of the body portion of the first opening on the base substrate is a major circle, and an orthographic projection of the auxiliary portion of the first opening on the base substrate protrudes in a second direction relative to the major circle.

According to some exemplary embodiments, a third opening of at least one third sub-pixel includes a body portion and an auxiliary portion, an orthographic projection of the body portion of the third opening on the base substrate is a major circle, and an orthographic projection of the auxiliary portion of the third opening on the base substrate protrudes in the second direction relative to the major circle.

According to some exemplary embodiments, the orthographic projection of the second opening of at least one second sub-pixel on the base substrate is a major circle.

According to some exemplary embodiments, an outline of the orthographic projection of the second opening of at least one second sub-pixel on the base substrate includes a second major arc and a second chord, and the second chord and an anode connection hole of the second sub-pixel where the second opening is located are respectively located on opposite sides of the second major arc.

According to some exemplary embodiments, an outline of the orthographic projection of the second opening of at least one second sub-pixel on the base substrate includes a second major arc and a second chord, and the second chord and an anode connection hole of the second sub-pixel where the second opening is located are located on a same side of the second major arc.

According to some exemplary embodiments, the orthographic projection of the second opening of the second sub-pixel on the base substrate and an orthographic projection of an anode connection hole of the second sub-pixel on the base substrate are located within an orthographic projection of an anode structure of the second sub-pixel on the base substrate; and the orthographic projection of the anode structure of the second sub-pixel on the base substrate is substantially a circle.

According to some exemplary embodiments, an outline of the pattern of the orthographic projection of the first opening of the first sub-pixel on the base substrate includes an arc portion and a non-arc portion, a first distance between the arc portion of the first opening and a boundary of the anode structure of the first sub-pixel at each position in a radial direction thereof is substantially the same, and a second distance between the non-arc portion of the first opening and the boundary of the anode structure of the first sub-pixel in the radial direction thereof is not equal to the first distance; and/or an outline of the pattern of the orthographic projection of the second opening of the second sub-pixel on the base substrate includes an arc portion and a non-arc portion, a third distance between the arc portion of the second opening and a boundary of an anode structure of the second sub-pixel at each position in a radial direction thereof is substantially the same, and a fourth distance between the non-arc portion of the second opening and the boundary of the anode structure of the second sub-pixel in the radial direction thereof is not equal to the third distance; and/or an outline of a pattern of an orthographic projection of a third opening of the third sub-pixel on the base substrate includes an arc portion and a non-arc portion, a fifth distance between the arc portion of the third opening and a boundary of the anode structure of the third sub-pixel at each position in a radial direction thereof is substantially the same, and a sixth distance between the non-arc portion of the third opening and the boundary of the anode structure of the third sub-pixel in the radial direction thereof is not equal to the fifth distance.

According to some exemplary embodiments, the second distance is greater than the first distance; and/or the fourth distance is greater than the third distance; and/or the sixth distance is greater than the fifth distance.

According to some exemplary embodiments, the display substrate further includes: a light emitting layer on a side of the anode structure away from the base substrate;

the orthographic projections of the first opening of the first sub-pixel, the second opening of the second sub-pixel and the third opening of the third sub-pixel on the base substrate respectively fall within the orthographic projections of the light emitting layers of respective sub-pixels on the base substrate;

the outline of the pattern of the orthographic projection of the first opening of the first sub-pixel on the base substrate includes an arc portion and a non-arc portion, a seventh distance between the arc portion of the first opening and a boundary of the light emitting layer of the first sub-pixel at each position in the radial direction thereof is substantially the same, and an eighth distance between the non-arc portion of the first opening and the boundary of the light emitting layer of the first sub-pixel in the radial direction thereof is not equal to the seventh distance; and/or the outline of the pattern of the orthographic projection of the second opening of the second sub-pixel on the base substrate includes an arc portion and a non-arc portion, a ninth distance between the arc portion of the second opening and a boundary of the light emitting layer of the second sub-pixel at each position in the radial direction thereof is substantially the same, and a tenth distance between the non-arc portion of the second opening and the boundary of the light emitting layer of the second sub-pixel in the radial direction thereof is not equal to the ninth distance; and/or the outline of the pattern of the orthographic projection of the third opening of the third sub-pixel on the base substrate includes an arc portion and a non-arc portion, an eleventh distance between the arc portion of the third opening and a boundary of the light emitting layer of the third sub-pixel at each position in the radial direction thereof is substantially the same, and a twelfth distance between the non-arc portion of the third opening and the boundary of the light emitting layer of the third sub-pixel in the radial direction thereof is not equal to the eleventh distance.

According to some exemplary embodiments, an outline of the orthographic projection of the second opening of at least one second sub-pixel on the base substrate includes a second major arc and a second outline side, the second outline side includes a plurality of sub-sides or curves at least partially surrounding an orthographic projection of an anode connection hole of the second sub-pixel on the base substrate.

According to some exemplary embodiments, the pattern of the orthographic projection of the second opening on the base substrate is a circle.

According to some exemplary embodiments, a radius of curvature of the rounded corner portion ranges from 1 micron to 10 microns.

According to some exemplary embodiments, the predetermined deflection angle ranges from 1° to 30°.

According to some exemplary embodiments, the orthographic projection of the second opening of at least one second sub-pixel on the base substrate has a shape of a droplet; and/or an orthographic projection of a third opening of at least one third sub-pixel on the base substrate has a shape of a droplet.

According to some exemplary embodiments, each of the orthographic projection of the second opening of the second sub-pixel on the base substrate and the orthographic projection of the third opening of the third sub-pixel on the base substrate is a circle, the display substrate further includes: an anode structure on a side of the pixel defining layer facing the base substrate; a pixel driving circuit between the base substrate and the anode structure; and an anode connection hole, wherein the anode structure is connected to the pixel driving circuit through the anode connection hole, the first opening of the first sub-pixel includes a body portion and an auxiliary portion, an orthographic projection of the body portion of the first opening on the base substrate is a circle, an orthographic projection of the auxiliary portion of the first opening on the base substrate protrudes, relative to the circle of the body portion of the first opening, toward an orthographic projection of the anode connection hole of the first sub-pixel where the first opening is located on the base substrate, and the pattern of the orthographic projection of the first opening of the first sub-pixel on the base substrate has a first axis of symmetry substantially parallel to a second direction.

According to some exemplary embodiments, the display substrate further includes a second display region, and the display substrate further includes:

a plurality of second pixel structures on the base substrate and in the second display region, wherein at least one of the second pixel structures includes a fourth sub-pixel and a fifth sub-pixel;

the pixel defining layer further includes a plurality of fourth openings and a plurality of fifth openings;

the first sub-pixel and the fourth sub-pixel emit light having a same color, and the second sub-pixel and the fifth sub-pixel emit light having a same color;

the fourth sub-pixel includes the fourth opening, and the fifth sub-pixel includes the fifth opening; and an area of the orthographic projection of the first opening of the first sub-pixel on the base substrate is less than an area of an orthographic projection of the fourth opening of the fourth sub-pixel on the base substrate, and an area of the orthographic projection of the second opening of the second sub-pixel on the base substrate is less than an area of an orthographic projection of the fifth opening of the fifth sub-pixel on the base substrate.

According to some exemplary embodiments, at least one second pixel structure further includes a plurality of sixth sub-pixels, and a third sub-pixel and the sixth sub-pixel emit light having a same color;

the pixel defining layer further includes a plurality of sixth openings, and the sixth sub-pixel includes the sixth opening; and an area of an orthographic projection of a third opening of the third sub-pixel on the base substrate is less than an area of an orthographic projection of the sixth opening of the sixth sub-pixel on the base substrate.

According to some exemplary embodiments, the plurality of second pixel structures are arranged on the base substrate in an array in a first direction and a second direction to form sub-pixel rows and sub-pixel columns; and a center of at least one sub-pixel in the first display region and a center of at least one sub-pixel in the second display region are located substantially on a same straight line parallel to the first direction or the second direction, and the at least one sub-pixel in the first display region has the same color as the at least one sub-pixel in the second display region.

According to some exemplary embodiments, in a sub-pixel row, a line connecting a center of at least one sub-pixel in the first display region and a center of at least one sub-pixel in the second display region is a broken line, the at least one sub-pixel in the first display region has the same color as the at least one sub-pixel in the second display region, the broken line includes a plurality of line segments, at least one line segment forms a fifth angle relative to the first direction, and the fifth angle is greater than 0° and less than or equal to 30°; and/or in a sub-pixel column, a line connecting a center of at least one sub-pixel in the first display region and a center of at least one sub-pixel in the second display region is a broken line, the at least one sub-pixel in the first display region has the same color as the at least one sub-pixel in the second display region, the broken line includes a plurality of line segments, at least one line segment forms a sixth angle relative to the first direction, and the sixth angle is greater than 0° and less than or equal to 30°.

According to some exemplary embodiments, light emitting layers of sub-pixels having the same color respectively located in the first display region and the second display region have substantially the same shape; and/or areas of orthographic projections of light emitting layers of sub-pixels having the same color respectively located in the first display region and the second display region on the base substrate are substantially equal to each other.

In another aspect, a display device including the display substrate described above is provided.

BRIEF DESCRIPTION OF THE DRAWINGS

By referring to accompanying drawings for a detailed description of exemplary embodiments disclosed herein, the features and advantages of the present disclosure will become more apparent, in the drawings.

DETAILED DESCRIPTION OF EMBODIMENTS

Figure 1:
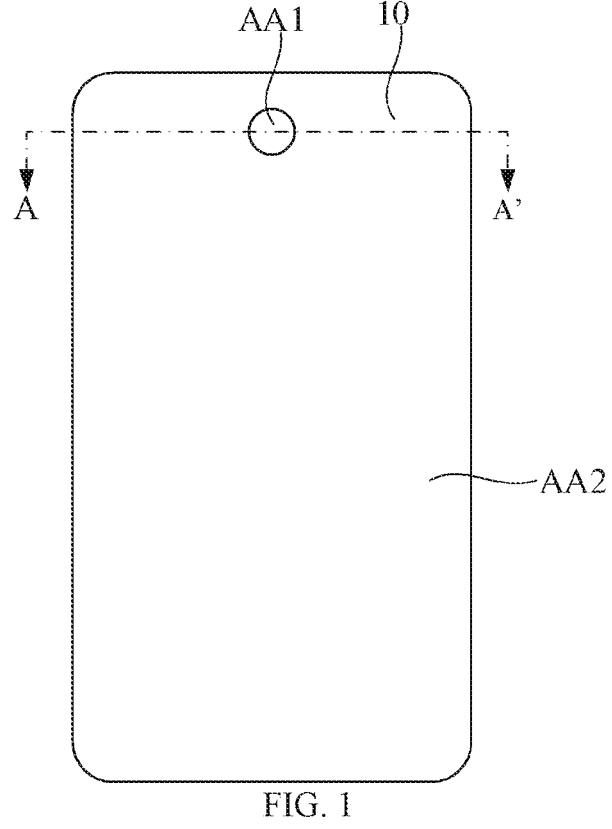
FIG. 1 shows a schematic plan view of a display device according to some exemplary embodiments of the present disclosure, in which a planar structure of a display substrate included in the display device is schematically shown.

In order to make objectives, technical solutions and advantages of the present disclosure clearer, the technical solutions of the embodiments of the present disclosure are clearly and completely described below with reference to the drawings. It is clearly that the described embodiments are just a part rather than all of the embodiments of the present disclosure. Based on the described embodiments of the present disclosure, all additional embodiments obtained by those ordinary skilled in the art without carrying out inventive effort fall within the protection scope of the present disclosure.

It should be noted that, in the drawings, for clarity and/or description purposes, a size and a relative size of elements may be enlarged. Accordingly, the size and the relative size of each element need not to be limited to those shown in the drawings. In the specification and drawings, the same or similar reference numerals indicate the same or similar components.

When an element is described as being "on", "connected to" or "coupled to" another element, that element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", etc. should be interpreted in a similar manner. In addition, the term "connection" may refer to a physical connection, an electrical connection, a communicative connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objectives of the present disclosure, "at least one selected from X, Y or Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", etc. may be used herein to describe a relationship between one element or feature and another element or feature as shown in the figures. It should be understood that the spatial relationship terms are intended to cover other different orientations of a device in use or operation in addition to the orientation described in the figures. For example, if the device in the figures is turned upside down, an element or feature described as "below" or "under" another element or feature will be oriented "above" or "on" the another element or feature.

Here, the expression "repetitive unit" may mean that at least two or more units are provided in the display substrate and these units are repeated immediately. The repetitive unit may refer to a combination of a plurality of sub-pixels, such as a combination of a plurality of sub-pixels used to display a pixel point, and a plurality of "repetitive units" are repeatedly arranged in an array on a base substrate. For example, a repetitive unit may include at least one pixel, such as two, three, four or more sub-pixels. In addition, here, for ease of description, a repetitive unit in a first display region is referred to as a first repetitive unit, and a repetitive unit in a second display region is referred to as a second repetitive unit. Herein, the expression "repetitive unit" may also be referred to as "pixel structure".

Herein, the expression "pixel density" refers to the number of repetitive units or sub-pixels per unit area. Similarly, the expression "distribution density" refers to the number of components (such as repetitive units, sub-pixels, spacers, etc.) per unit area.

Herein, unless otherwise specified, the expression "opening" refers to an opening of a pixel defining layer in each sub-pixel. The opening exposes at least part of an anode structure of a light emitting device of the sub-pixel, and at least part of a light emitting layer of the light emitting device is also located in the opening, that is, the opening corresponds to a light emitting region of the sub-pixel.

Herein, unless otherwise specified, the expression "center of opening" refers to a geometric center or a centroid of an orthographic projection of the opening on the base substrate. For example, in a case that the opening is a circle, the center of the opening is a center of the circle; in a case that the opening is an ellipse, the center of the opening is a center of the ellipse, that is, an intersection of a major axis and a minor axis of the ellipse; in a case that the opening is a rectangle, the center of the opening is a center of the rectangle, that is, an intersection of two diagonal lines of the rectangle.

Herein, unless otherwise specified, the expression "A and B are located substantially on a same straight line extending parallel to a first direction" includes the following cases: A and B are located on the same straight line extending parallel to the first direction; positions of A and B have an error in a direction perpendicular to the first direction, and the error is less than or equal to ±5 microns.

Herein, unless otherwise specified, "a distance between a first opening and a second opening" and similar expressions refers to a distance between a center of the first opening and a center of the second opening, and "a separation distance between the first opening and the second opening" and similar expressions refers to a distance between an edge of the first opening closest to the second opening and an edge of the second opening closest to the first opening.

Embodiments of the present disclosure provide a display substrate including a first display region. The display substrate includes: a base substrate; a first pixel structure in the first display region, where the first pixel structure includes two first sub-pixels and two second sub-pixels; and a pixel defining layer on the base substrate, where the pixel defining layer includes a first opening and a second opening in the first display region. The first sub-pixel includes the first opening, and the second sub-pixel includes the second opening. In the first pixel structure, patterns of orthographic projections of the first openings of the two first sub-pixels on the base substrate have a first center and a third center, respectively, and patterns of orthographic projections of the second openings of the second first sub-pixels on the base substrate have a second center and a fourth center, respectively. The first center, the second center, the third center and the fourth center are connected in sequence to form a first quadrilateral. At least two sides of the first quadrilateral have lengths not equal to each other, and a ratio of a length of one of the at least two sides to a length of another of the at least two sides ranges from 0.8 to 1.2. In this way, the opening of each sub-pixel may be increased without increasing an area of an anode structure, thereby increasing a lifespan of an OLED display device.

Figure 2:
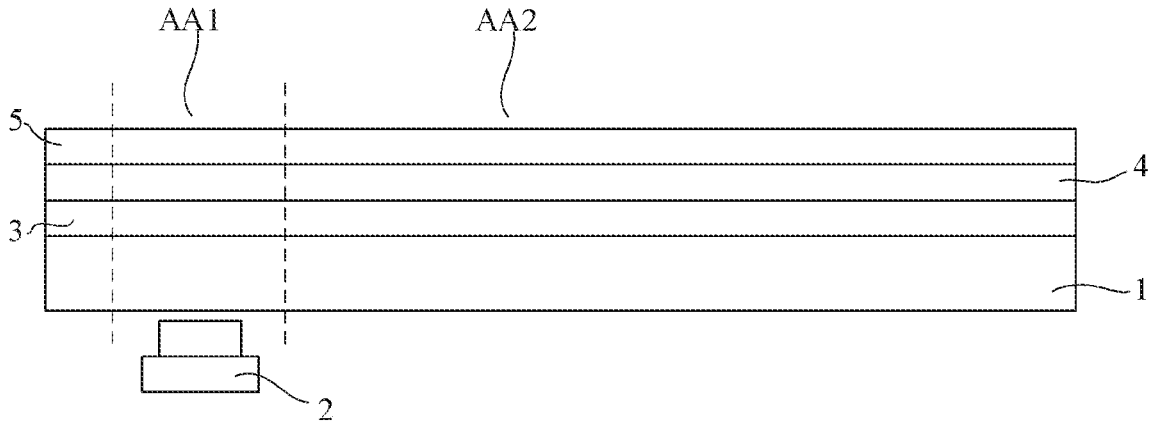
FIG. 2 shows a schematic cross-sectional view of a display device according to some exemplary embodiments of the present disclosure taken along line AA' in FIG. 1.

FIG. 1 shows a schematic plan view of a display device according to some exemplary embodiments of the present disclosure, in which a planar structure of a display substrate included in the display device is schematically shown. FIG. 2 shows a schematic cross-sectional view of a display device according to some exemplary embodiments of the present disclosure taken along line AA' in FIG. 1.

As shown in FIG. 1, the display device according to embodiments of the present disclosure includes a display substrate 10. The display substrate 10 includes a display region that may include a first display region AA1 and a second display region AA2. For example, the first display region AA1 and the second display region AA2 do not overlap with each other. For example, the second display region AA2 at least partially surrounds (for example, completely surrounds) the first display region AA1.

For a display substrate with an under-screen sensor (for example, an image sensor), in order to ensure a good imaging effect or other effect of the under-screen sensor (for example, image sensor), a light transmittance of the display region corresponding to the under-screen sensor may be greater than that of other display regions of the display substrate.

As shown in FIG. 2, the display substrate 10 may include a base substrate 1. A sensor 2 may be provided on a back of the base substrate 1 at the first display region AA1 (shown as a lower side in FIG. 2, which may be, for example, a side opposite to a light exit direction during display), and the first display region AA1 may meet imaging requirements of the sensor 2 for the light transmittance.

For example, the light transmittance of the first display region AA1 is greater than that of the second display region AA2. The sensor 2 may be, for example, an image sensor or an infrared sensor. The sensor 2 is used to receive light from a display side of the display substrate 10 (an upper side in FIG. 2, which may be, for example, the light exit direction during display, or a direction of human eyes during display), so that operations such as image capturing, distance sensing and light intensity sensing may be performed. The light may pass through, for example, the first display region AA1 and then irradiate on the sensor to be sensed by the sensor.

It should be noted that in exemplary embodiments shown, the second display region AA2 completely surrounds the first display region AA1, but embodiments of the present disclosure are not limited thereto. For example, in other embodiments, the first display region AA1 may be located at an upper edge of the display substrate. For example, three sides of the first display region AA1 are surrounded by the second display region AA2, and an upper side of the first display region AA1 is aligned with the upper edge of the display substrate. For another example, the first display region AA1 may be located at the upper edge of the display substrate and arranged along an entire width of the display substrate.

For example, the first display region AA1 may have a shape of a circle, an ellipse, a droplet or a rectangle, and the second display region AA2 may have a shape of a circle, an ellipse or a rectangle, but embodiments of the present disclosure are not limited thereto. For another example, the shape of the first display region AA1 and the shape of the second display region AA2 may both be rectangles, rounded rectangles or other suitable shapes.

For the display substrate shown in FIG. 1 and FIG. 2, an OLED display technology may be adopted. The OLED display substrate has advantages of wide viewing angle, high contrast, fast response, low power consumption, foldability, flexibility, etc., and has been more and more widely used in display products. With the development and in-depth application of the OLED display technology, there are increasingly strong demands for displays with high screen-to-body ratio. In the display substrate shown in FIG. 1 and FIG. 2, a solution of under-screen camera is adopted, in this way, a notch region may be eliminated so as to avoid punching holes in the display screen, therefore, the screen-to-body ratio may be increased, thereby achieving a good visual experience.

In addition, the display substrate may further include a driving circuit layer, a light emitting device layer and an encapsulation layer that are arranged on the base substrate 1. For example, a pixel driving circuit 3, a light emitting device layer 4 and an encapsulation layer 5 are schematically shown in FIG. 2. The pixel driving circuit 3 includes a pixel driving circuit structure, and the light emitting device layer 4 includes a light emitting device such as an OLED. The pixel driving circuit structure may control the light emitting device of each sub-pixel to emit light, so as to achieve a display function. The pixel driving circuit structure may include a thin film transistor, a storage capacitor, and various signal lines. The various signal lines may include a gate line, a data line, an ELVDD power line, an ELVSS power line and so on, so as to provide various signals such as a control signal, a data signal and a power supply voltage to the pixel driving circuit in each sub-pixel.

Figure 3A:
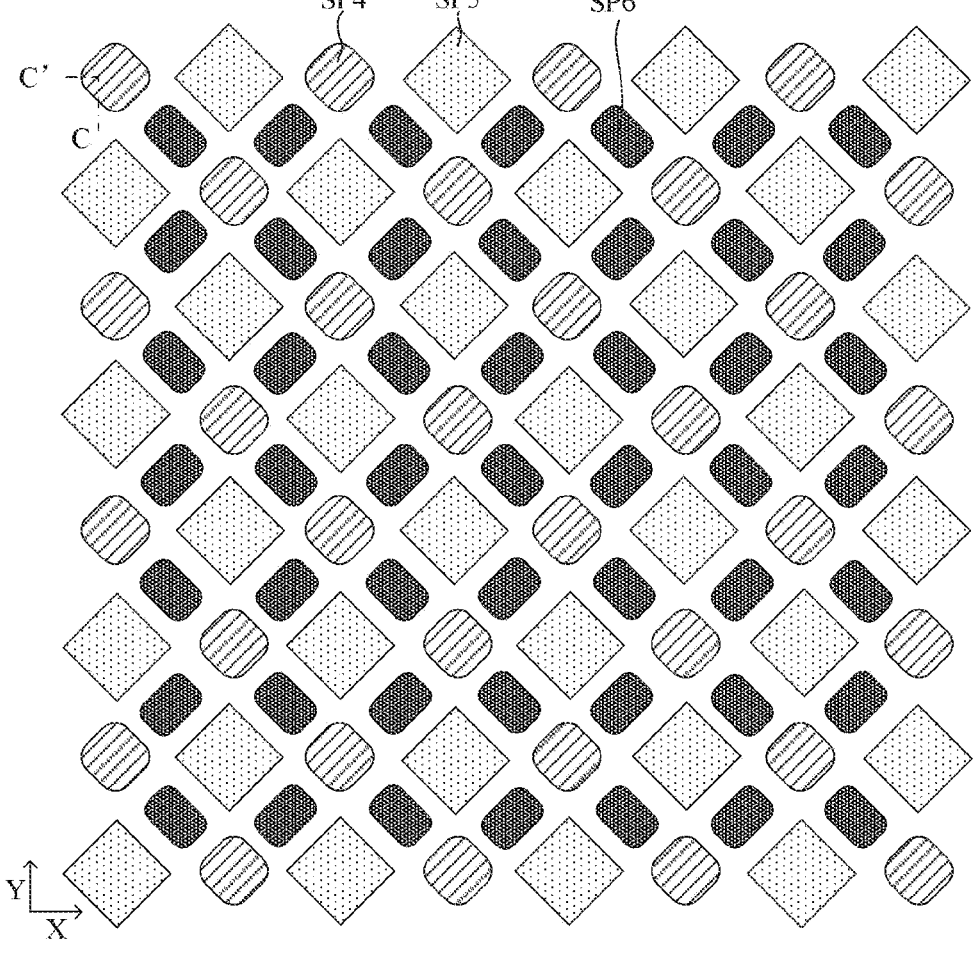
FIG. 3A shows a schematic diagram of a partial structure of a display substrate in a second display region according to some exemplary embodiments of the present disclosure.
Figure 3B:
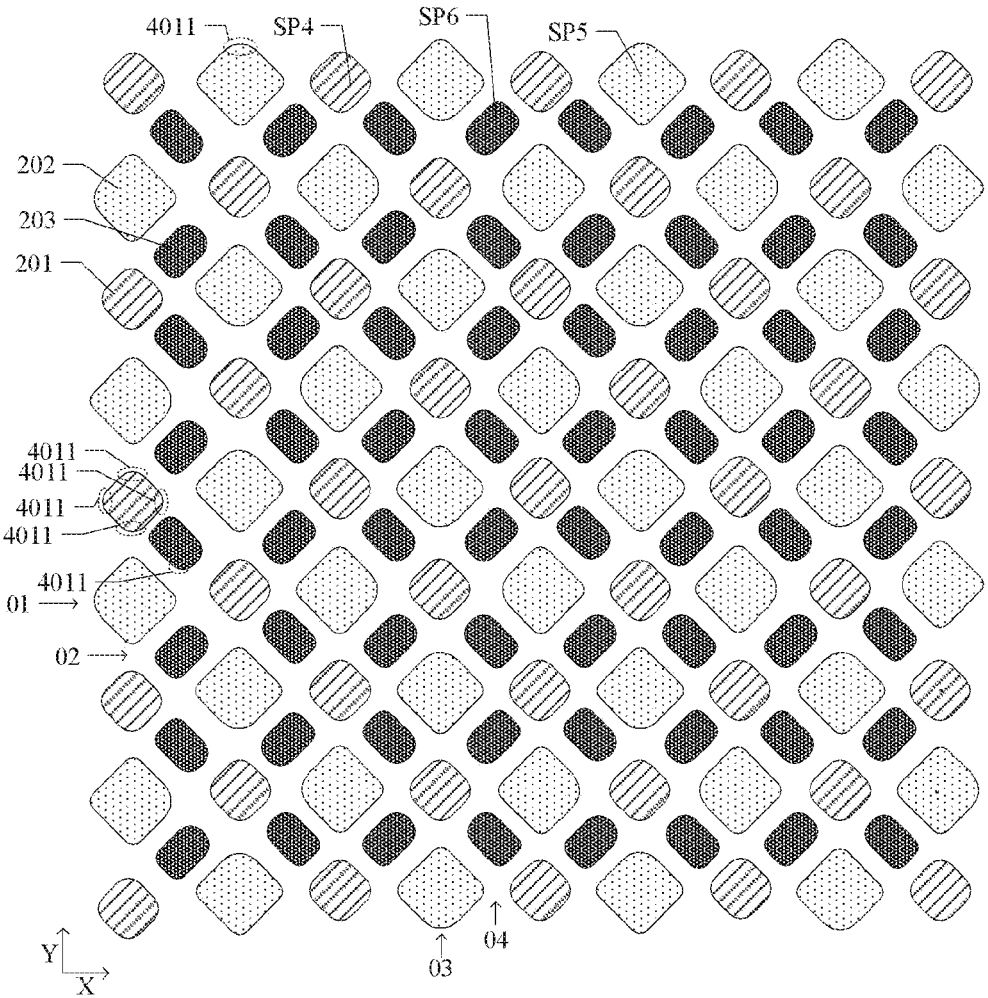
FIG. 3B shows a schematic diagram of a partial structure of a display substrate in a second display region according to other exemplary embodiments of the present disclosure.
Figure 4:
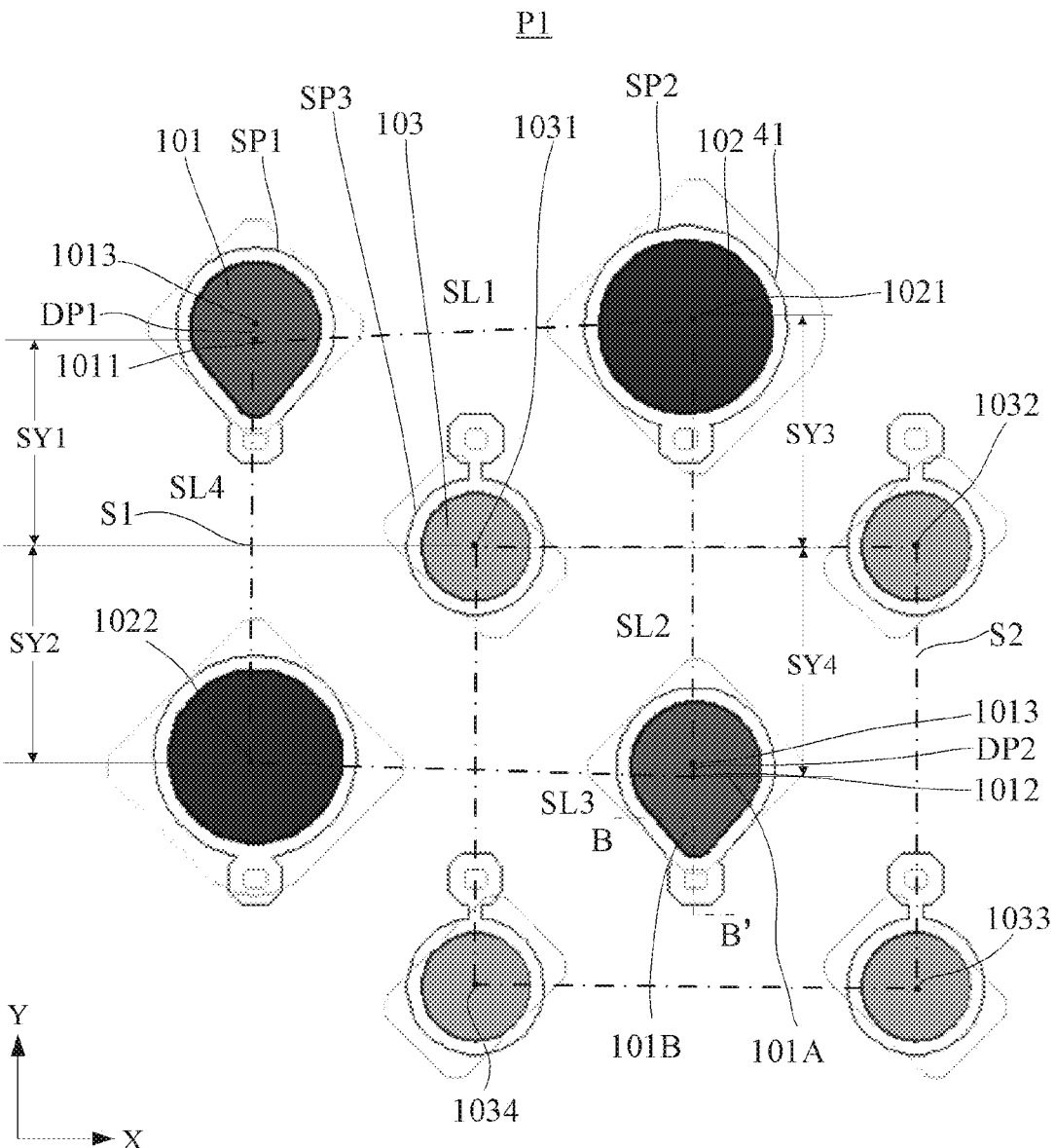
FIG. 4 shows a schematic diagram of a partial structure of a display substrate in a first display region according to some exemplary embodiments of the present disclosure, in which a pixel arrangement structure of a repetitive unit in the first display region is schematically shown.
Figure 5:
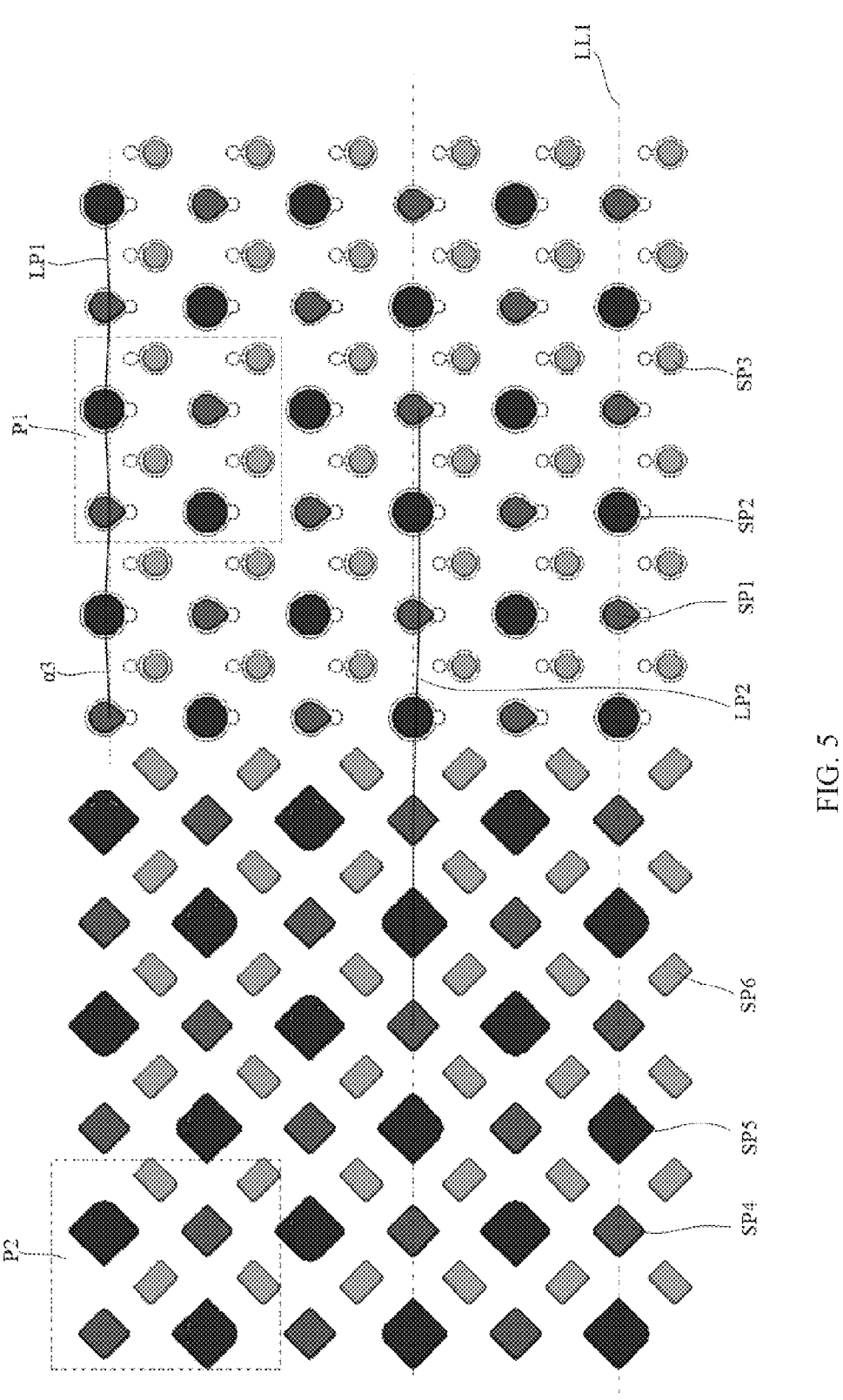
FIG. 5 shows a schematic diagram of a partial structure of a display substrate in a connection region between a first display region and a second display region according to some exemplary embodiments of the present disclosure.

FIG. 3A shows a schematic diagram of a partial structure of a display substrate in a second display region according to some exemplary embodiments of the present disclosure. FIG. 3B shows a schematic diagram of a partial structure of a display substrate in a second display region according to other exemplary embodiments of the present disclosure. FIG. 4 shows a schematic diagram of a partial structure of a display substrate in a first display region according to some exemplary embodiments of the present disclosure, in which a pixel arrangement structure of a repetitive unit in the first display region is schematically shown. FIG. 5 shows a schematic diagram of a partial structure of a display substrate in a connection region between a first display region and a second display region according to some exemplary embodiments of the present disclosure.

Referring to FIG. 3A to FIG. 5, the first display region AA1 includes a plurality of first repetitive units (i.e., first pixel structures) P1 arranged in an array, and the second display region AA2 includes a plurality of second repetitive units (i.e., second pixel structures) P2 arranged in an array. Each of the repetitive units P1 and P2 may include a plurality of sub-pixels. In some embodiments, each first repetitive unit P1 may include at least one first pixel unit, and each first pixel unit may further include a plurality of sub-pixels, such as a red sub-pixel, a green sub-pixel and a blue sub-pixel. Similarly, the second repetitive unit P2 may include at least one second pixel unit, and each second pixel unit may further include a plurality of sub-pixels, such as a red sub-pixel, a green sub-pixel and a blue sub-pixel.

It should be noted that the red sub-pixel, the green sub-pixel and the blue sub-pixel are illustrated by way of example in describing embodiments of the present disclosure, but embodiments of the present disclosure are not limited thereto. That is, each repetitive unit may include sub-pixels having at least two different colors, such as a fourth sub-pixel, a fifth sub-pixel and a sixth sub-pixel, and a first color, a second color and a third color are different colors. Herein, for ease of description, the plurality of sub-pixels included in the first pixel unit are respectively referred to as a first sub-pixel, a second sub-pixel and a third sub-pixel, and the plurality of sub-pixels included in the second pixel unit are respectively referred to as a fourth sub-pixel, a fifth sub-pixel and a sixth sub-pixel. For example, the first sub-pixel and the fourth sub-pixel may emit light having the same color, such as red; the second sub-pixel and the fifth sub-pixel may emit light having the same color, such as blue; and the third sub-pixel and the sixth sub-pixel may emit light having the same color, such as green.

For example, in some exemplary embodiments of the present disclosure, one first pixel unit includes at least one first sub-pixel (for example, one first sub-pixel is shown in FIG. 4), at least one second sub-pixel (for example, one second sub-pixel is shown in FIG. 4), and at least one third sub-pixel (for example, two third sub-pixels are shown in FIG. 4). For ease of description, the first sub-pixel, the second sub-pixel and the third sub-pixel included in the first pixel unit are denoted by reference numerals SP1, SP2 and SP3, respectively. One second pixel unit includes at least one fourth sub-pixel (for example, one fourth sub-pixel is shown in FIG. 5), at least one fifth sub-pixel (for example, one fifth sub-pixel is shown in FIG. 5), and at least one sixth sub-pixel (for example, two sixth sub-pixels are shown in FIG. 5). For ease of description, the fourth sub-pixel, the fifth sub-pixel and the sixth sub-pixel included in the second pixel unit are denoted by reference numerals SP4, SP5 and SP6, respectively. For example, the first color may be red, the second color may be blue, and the third color may be green.

A sub-pixel may include a light emitting device and a pixel driving circuit for driving the light emitting device to emit light. The light emitting device may include a first electrode, a second electrode and a light emitting layer between the first electrode and the second electrode. The pixel driving circuit may include a transistor, a capacitor and other elements. The pixel driving circuit may receive a signal transmitted by a signal line provided on the display substrate, generate a current for driving the light emitting device, and achieve a purpose of driving the light emitting device to emit light through a connection with the first electrode or the second electrode. For example, the pixel driving circuit is arranged on the base substrate, and the light emitting device is located on a side of the pixel driving circuit away from the base substrate. In some embodiments, the display substrate further includes a pixel defining layer on a side of the first electrode away from the pixel driving circuit. The pixel defining layer includes a plurality of openings, and each sub-pixel corresponds to at least one opening (for example, one opening) of the pixel defining layer. An actual light emitting region or display region of a sub-pixel is substantially equivalent to the opening of the pixel defining layer corresponding to that sub-pixel. In some embodiments, the opening of the pixel defining layer corresponding to each sub-pixel or the actual light emitting region of each sub-pixel has an area less than that of the first electrode, and a projection of the opening of the pixel defining layer corresponding to that sub-pixel or the actual light emitting region of that sub-pixel on the base substrate completely falls within a projection of the first electrode on the base substrate. For ease of illustration, FIG. 3B to FIG. 5 show approximate positions and shapes of the openings of the pixel defining layer corresponding to the sub-pixels to show a distribution of the sub-pixels.

It should be noted that, unless otherwise specified, herein, the projection, the area and other features of a sub-pixel may be represented by the projection and the area of the opening of the sub-pixel.

For example, in some embodiments of the present disclosure, an arrangement of sub-pixels in each repetitive unit may refer to an existing pixel arrangement, such as GGRB, RGBG, RGB, etc., which is not limited in embodiments of the present disclosure.

As shown in FIG. 3B to FIG. 5, the first display region AA1 has a first pixel density, and the second display region AA2 has a second pixel density not less than the first pixel density. For example, the second pixel density is greater than the first pixel density. For example, herein, a pixel density may be a ratio of an area of the actual light emitting regions of the sub-pixels in a unit area to that unit area. Alternatively, for example, the pixel density is a ratio of an area of the anode electrodes of the sub-pixels in a unit area to that unit area. Alternatively, for example, the pixel density reflects a ratio of an area of an opaque region or region that has a low transmittance in a unit area to that unit area. This is not limited in embodiments of the present disclosure. In the first display region AA1, a blank region between the plurality of first repetitive units P1 may allow more light to pass through, so as to increase the light transmittance of the region. Therefore, the first display region AA1 has a greater light transmittance than the second display region AA2.

It should be noted that herein, the blank region between the plurality of first repetitive units P1 may be referred to as a light transmitting region.

Referring to FIG. 3A to FIG. 5, the display substrate may include a plurality of openings that are respectively located in a plurality of sub-pixels in the first display region AA1 and the second display region AA2 to expose at least part of the anode structures of the corresponding sub-pixels. For ease of description, the opening of the first sub-pixel SP1 in the first display region AA1 is referred to as a first opening, denoted by reference numeral 101; the opening of the second sub-pixel SP2 in the first display region AA1 is referred to as a second opening, denoted by reference numeral 102; the opening of the third sub-pixel SP3 in the first display region AA1 is referred to as a third opening, denoted by reference numeral 103; the opening of the fourth sub-pixel SP4 in the second display region AA2 is referred to as a fourth opening, denoted by reference numeral 201; the opening of the fifth sub-pixel SP5 in the second display region AA2 is referred to as a fifth opening, denoted by reference numeral 202; the opening of the sixth sub-pixel SP6 in the second display region AA2 is referred to as a sixth opening, denoted by reference numeral 203.

As shown in FIG. 3A and FIG. 3B, a plurality of fourth sub-pixels SP4 and a plurality of fifth sub-pixels SP5 are alternately arranged in a first direction (X direction as shown in FIG. 3A and FIG. 3B) to form a first pixel row 01, and a plurality of sixth sub-pixels SP6 are arranged in the first direction to form a second pixel row 02. The first pixel row 01 and the second pixel row 02 are alternately arranged in a second direction (Y direction as shown in FIG. 3A and FIG. 3B) intersecting the first direction X, and staggered from each other in the first direction. For example, adjacent fourth sub-pixel SP4 and fifth sub-pixel SP5 are arranged in the first direction X. As shown in FIG. 3A and FIG. 3B, a plurality of fourth sub-pixels SP4 and a plurality of fifth sub-pixels SP5 are alternately arranged in the second direction Y to form a plurality of first pixel columns 03, and a plurality of sixth sub-pixels SP6 are arranged in an array in the first direction X and the second direction Y to form the plurality of second pixel rows 02 and a plurality of second pixel columns 04. The plurality of first pixel columns 03 and the plurality of second pixel columns 04 are alternately arranged in the first direction and staggered from each other in the second direction, that is, a second pixel row 02 where a sixth sub-pixel SP6 is located is located between two adjacent first pixel rows 01, and a second pixel column 04 where the sixth sub-pixel SP6 is located is located between two adjacent first pixel columns 03.

For example, the first direction X intersects the second direction Y. For example, an angle between the first direction and the second direction may range from 80 degrees to 100 degrees. For example, the angle between the first direction and the second direction may range from 85 degrees to 95 degrees. For example, the first direction may be perpendicular to the second direction, but embodiments of the present disclosure are not limited thereto, and the first direction may not be perpendicular to the second direction. In embodiments of the present disclosure, the first direction and the second direction may be interchanged.

Referring to FIG. 4 and FIG. 5 in combination, the first repetitive unit P1 may include at least two first pixel units (two first pixel units are shown in FIG. 4). Each first pixel unit includes four sub-pixels, including one first sub-pixel SP1, one second sub-pixel SP2, and two third sub-pixels SP3. In one first repetitive unit P1, a plurality of sub-pixels are arranged in four rows and four columns. In a first row, a first sub-pixel SP1 and a second sub-pixel SP2 are arranged in a first column and a third column, respectively. In a second row, two third sub-pixels SP3 are arranged in a second column and a fourth column, respectively. In a third row, a second sub-pixel SP2 and a first sub-pixel SP1 are arranged in the first column and the third column, respectively. In a fourth row, two third sub-pixels SP3 are arranged in the second column and the fourth column, respectively. That is, in the first display region AA1, the first sub-pixels SP1 and the second sub-pixels SP2 of the plurality of first pixel units are alternately distributed in the first direction X and the second direction Y, and the third sub-pixels SP3 of the plurality of first pixel units are arranged in an array in the first direction X and the second direction Y.

In other words, in the first display region AA1, the first sub-pixels SP1 and the second sub-pixels SP2 are arranged in an array in the first direction X and the second direction Y, and the plurality of third sub-pixels SP3 are arranged in an array in the first direction X and the second direction Y. At least one third sub-pixel SP3 is located within a first quadrilateral S1. A projection of the third sub-pixel SP3 in the first direction X does not overlap with a projection of the first sub-pixel SP1 in the first direction X or a projection of the second sub-pixel SP2 in the first direction X, and a projection of the third sub-pixel SP3 in the second direction Y does not overlap with a projection of the first sub-pixel SP1 in the second direction Y or a projection of the second sub-pixel SP2 in the second direction Y.

For example, in embodiments of the present disclosure, a plurality of first repetitive units P1 are arranged on the base substrate in an array in the first direction X and the second direction Y, so as to form sub-pixel rows and sub-pixel columns. A line connecting centers of the first openings 101 of a plurality of first sub-pixels in a same sub-pixel row and centers of the second openings 102 of a plurality of second sub-pixels in the same sub-pixel row is a broken line LP1. The broken line LP1 may include a plurality of line segments, and at least one line segment forms a third angle α3 relative to the first direction X. The third angle α3 is greater than 0° and less than or equal to 30°, for example, the third angle α3 is greater than 0° and less than or equal to 20°. For another example, referring to FIG. 22, a line connecting centers of the first openings of a plurality of first sub-pixels in a same sub-pixel column and centers of the second openings of a plurality of second sub-pixels in the same sub-pixel column is a broken line LP3. The broken line LP3 may include a plurality of line segments, and at least one line segment forms a fourth angle α4 relative to the second direction Y. The fourth angle α4 is greater than 0° and less than or equal to 30°, for example, the fourth angle α4 is greater than 0° and less than or equal to 20°.

The second repetitive unit P2 may include at least two second pixel units (two second pixel units are shown in FIG. 3A and FIG. 3B). Each second pixel unit includes four sub-pixels, including one fourth sub-pixel SP4, one fifth sub-pixel SP5, and two sixth sub-pixels SP6. In one second repetitive unit P2, a plurality of sub-pixels are arranged in four rows and four columns. In a first row, a fourth sub-pixel SP4 and a fifth sub-pixel SP5 are arranged in a first column and a third column, respectively. In a second row, two sixth sub-pixels SP6 are arranged in a second column and a fourth column, respectively. In a third row, a fifth sub-pixel SP5 and a fourth sub-pixel SP4 are arranged in the first column and the third column, respectively. In a fourth row, two sixth sub-pixels SP6 are arranged in the second column and the fourth column, respectively. That is, in the second display region AA2, the fourth sub-pixels SP1 and the fifth sub-pixels SP5 of the plurality of second pixel units are alternately distributed in the first direction X and the second direction Y, and the sixth sub-pixels SP6 of the plurality of second pixel units are arranged in an array in the first direction X and the second direction Y.

As shown in FIG. 5, the second repetitive units P2 are arranged on the base substrate in an array in the first direction X and the second direction Y, so as to form sub-pixel rows and sub-pixel columns. Centers of at least some sub-pixels in the first display region AA1 and centers of sub-pixels having the same color in the second display region AA2 are located substantially on a same straight line parallel to the first direction X or the second direction Y. For example, as shown in FIG. 5, centers of a plurality of second sub-pixels SP2 in the first display region AA1 and centers of fifth sub-pixels SP5 in the second display region AA2 are located substantially on a same straight line (for example, straight line LL1 shown in FIG. 5) parallel to the first direction X, and the plurality of second sub-pixels SP2 in the first display region AA1 and the fifth sub-pixels SP5 in the second display region AA2 have the same color.

Continuing to refer to FIG. 5, in a same sub-pixel row, a line connecting centers of at least some sub-pixels in the first display region AA1 and centers of sub-pixels in the second display region AA2 is a broken line, and the at least some sub-pixels in the first display region AA1 and the sub-pixels in the second display region AA2 have the same color. The broken line includes a plurality of line segments, and at least one line segment forms a fifth angle relative to the first direction X. The fifth angle is greater than 0° and less than or equal to 30°, for example, the fifth angle is greater than 0° and less than or equal to 20°; and/or in a same sub-pixel column, a line connecting centers of at least some sub-pixels in the first display region AA1 and centers of sub-pixels in the second display region AA2 is a broken line, and the at least some sub-pixels in the first display region AA1 and the sub-pixels in the second display region AA2 have the same color. The broken line includes a plurality of line segments, and at least one line segment forms a sixth angle relative to the first direction X. The sixth angle is greater than 0° and less than or equal to 30°, for example, the sixth angle is greater than 0° and less than or equal to 20°. For example, as shown in FIG. 5, in a same sub-pixel row, a line connecting centers of the first sub-pixels SP1 in the first display region AA1 and centers of the fourth sub-pixels SP4 in the second display region AA2 is a broken line LP2, and the first sub-pixels SP1 in the first display region AA1 and the fourth sub-pixels SP4 in the second display region AA2 have the same color. The broken line LP2 includes a plurality of line segments, and at least one line segment forms the fifth angle relative to the first direction X. The fifth angle is greater than 0° and less than or equal to 30°, for example, the fifth angle is greater than 0° and less than or equal to 20°.

In embodiments of the present disclosure, the first sub-pixel, the second sub-pixel and the third sub-pixel are sub-pixels emitting light having different colors, and the fourth sub-pixel, the fifth sub-pixel and the sixth sub-pixel are sub-pixels emitting light having different colors. For example, the first sub-pixel and the fourth sub-pixel being red sub-pixels, the second sub-pixel and the fifth sub-pixel being blue sub-pixels, and the third sub-pixel and the sixth sub-pixel being green sub-pixels are taken as examples for description. However, this does not constitute a limitation to embodiments of the present disclosure.

For example, an area of the opening of at least one blue sub-pixel (the second sub-pixel or the fifth sub-pixel) is greater than an area of the opening of at least one red sub-pixel (the first sub-pixel or the fourth sub-pixel), and an area of the light emitting region of at least one red sub-pixel is greater than an area of the opening of at least one green sub-pixel (the third sub-pixel or the sixth sub-pixel), so as to prolong a service life of the display substrate.

As shown in FIG. 3A and FIG. 3B, an orthographic projection of the fourth opening 201 of the fourth sub-pixel SP4 on the base substrate may have a shape such as rhombus, rounded rhombus, or the like. An orthographic projection of the fifth opening 202 of the fifth sub-pixel SP5 on the base substrate may have a shape such as rhombus, rounded rhombus, or the like. An orthographic projection of the sixth opening 203 of the sixth sub-pixel SP6 on the base substrate may have a shape such as rhombus, rounded rhombus, rectangle, rounded rectangle, octagon, or the like.

For example, as shown in FIG. 3A and FIG. 3B, the sixth openings 203 of adjacent sixth sub-pixels SP6 may be rounded rectangles that are symmetrical to each other.

As shown in FIG. 3B, in the second display region AA2, the shape of the opening of at least one sub-pixel may be a pattern including a rounded corner, and the shape of the light emitting region of the sub-pixel may also be a pattern including a rounded corner. For example, the shape of the anode of the sub-pixel may also be a pattern including a rounded corner. The pattern of the opening of the sub-pixel may include four straight sides, at least two adjacent straight sides are connected by a curved segment, and the curved segment forms a rounded corner. However, embodiments of the present disclosure are not limited thereto. The pattern of the opening of the sub-pixel may also include three straight sides, five straight sides or six straight sides, and the number of vertex corners included in the opening may vary accordingly.

For example, an orthographic projection of the opening of the pixel defining layer on the base substrate falls within an orthographic projection of the corresponding light emitting layer on the base substrate, that is, the light emitting layer covers the opening of the pixel defining layer. For example, the area of the light emitting layer is greater than the area of the corresponding opening of the pixel defining layer, that is, in addition to a portion inside the opening of the pixel defining layer, the light emitting layer further includes at least a portion covering a physical structure of the pixel defining layer. The light emitting layer generally covers the physical structure of the pixel defining layer at each boundary of the opening of the pixel defining layer.

For example, the light emitting layer of the fourth sub-pixel SP4 and the light emitting layer of the fifth sub-pixel SP5 adjacent to the fourth sub-pixel SP4 may or may not overlap on the pixel defining layer. For example, the light emitting layer of the fourth sub-pixel SP4 and the light emitting layer of the sixth sub-pixel SP6 adjacent to the fourth sub-pixel SP4 may or may not overlap on the pixel defining layer. For example, the light emitting layer of the fifth sub-pixel SP5 and the light emitting layer of the sixth sub-pixel SP6 adjacent to the fifth sub-pixel SP5 may or may not overlap on the pixel defining layer.

Figure 6:
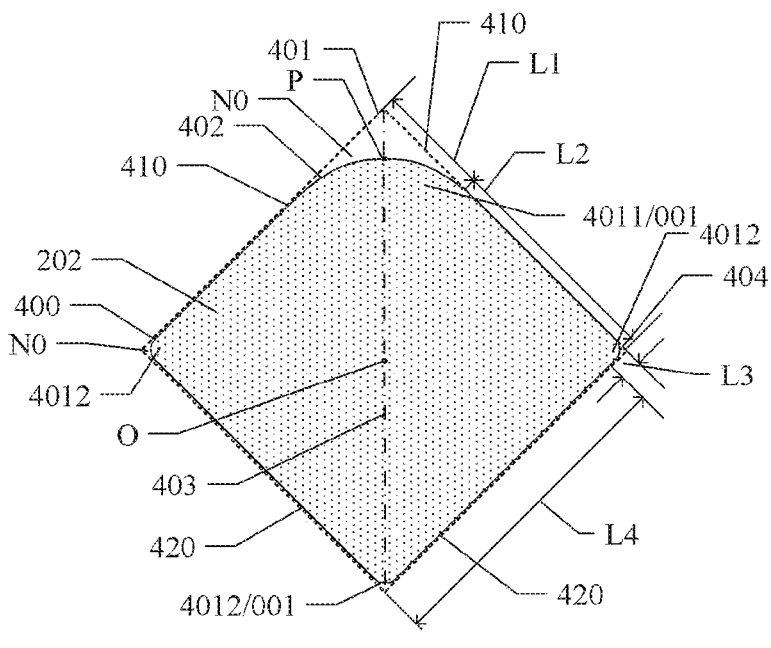
FIG. 6 shows a schematic diagram of a shape of an opening shown in FIG. 3B.

FIG. 6 shows a schematic diagram of a shape of an opening shown in FIG. 3B. As shown in FIG. 3B and FIG. 6, the sides or extension lines of these sides of the opening 201, 202, or 203 are connected in sequence to form a polygon 400. A plurality of corner portions of the opening 201, 202, or 203 of at least one sub-pixel include at least a fourth corner portion 4011. An area of a non-overlapping region N0 of the fourth corner portion 4011 and a vertex corner 401 of the polygon 400 corresponding to the fourth corner portion 4011 is greater than an area of a non-overlapping region N0 of at least one other corner portion and a vertex corner 401 of the polygon 400 corresponding to the corner portion.

For example, FIG. 6 schematically shows that all vertex corners of the polygon 400 have the non-overlapping regions N0, but embodiments of the present disclosure are not limited thereto, and some of the vertex corners of the polygon may have the non-overlapping region.

For example, as shown in FIG. 3B and FIG. 6, in at least two sub-pixels having different colors (for example, the fourth sub-pixel and the fifth sub-pixel, or the fourth sub-pixel and the sixth sub-pixel, or the fifth sub-pixel and the sixth sub-pixel, or the fourth sub-pixel, the fifth sub-pixel and the sixth sub-pixel), the shape of the opening 201, 202, or 203 may be obtained by cutting off at least one first vertex corner 401 of the polygon 400. For example, a cut line 402 used to cut off the first vertex corner 401 of the polygon 400 may include a line segment with a regular shape, such as a curve or a straight line, or may be a line segment with an irregular shape.

For example, embodiments of the present disclosure schematically show that the polygon 400 is a quadrilateral. For example, the shape of the polygon corresponding to sub-pixels having at least one color may be a rhombus, a rectangle or a square, but embodiments of the present disclosure are not limited thereto. The polygon 400 may also be a triangle, a pentagon or a hexagon, etc., which is not limited in embodiments of the present disclosure. For example, the vertex corners of the polygon may have equal or unequal angles.

As shown in FIG. 3B and FIG. 6, the vertex corners of the opening 202 include the fourth corner portion 4011, and the fourth corner portion 4011 is formed by cutting off the first vertex corner 401 formed by two first sides 410 of the polygon 400. For example, a ratio of a length of a cut portion L1 of at least one of the two first sides 410 to a length of the first side 410 is in a range of 0.2 to 0.8. A remaining portion L2 of the first side 410 of the polygon 400 obtained by cutting off the first line segment L1 forms a side for connecting to form an opening 202 of the fourth corner portion 4011. For example, both ends of the fourth corner portion 4011 are connected to two straight sides of the opening 202, respectively, and at least one of the two straight sides is a remaining straight side obtained by cutting off the first line segment L1 from the first side 410 of the polygon 400.

For example, at least one first vertex corner 401 may be cut off from the polygon 400 to form at least one fourth corner portion 4011. For example, one polygon 400 includes a plurality of first vertex corners 401 with equal angles, and a plurality of fourth corner portions 4011 formed by cutting off the plurality of first vertex corners 401 have identical parameters such as shape and size.

As shown in FIG. 3B and FIG. 6, the ratio of the length of the first line segment L1 to the length of the first side 410 is in a range of 0.2 to 0.8. For example, the ratio of the length of the first line segment L1 to the length of the first side 410 is in a range of 0.3 to 0.7; for example, the ratio of the length of the first line segment L1 to the length of the first side 410 is in a range of 0.4 to 0.6; for example, the ratio of the length of the first line segment L1 to the length of the first side 410 is 0.5.

For example, as shown in FIG. 3B and FIG. 6, a ratio of the length of the first line segment L1 to a length of the remaining portion L2 is in a range of 0.25 to 4. For example, the ratio of the length of the first line segment L1 to the length of the remaining portion L2 is in a range of 1 to 3. The ratio of the length of the first line segment L1 to the length of the remaining portion L2 is in a range of 0.5 to 2.

For example, as shown in FIG. 3B and FIG. 6, at least two types of sub-pixels having different colors include different numbers of fourth corner portions 4011. For example, two types of sub-pixels having different colors including different numbers of fourth corner portions 4011 may mean that: the sub-pixels having the same color include the same number of first corner portions, while in two sub-pixels having different colors, the number of first corner portions in one sub-pixel is different from the number of first corner portions in the other sub-pixel having a different color. For example, two types of sub-pixels 100 having different colors including different numbers of fourth corner portions 4011 may also mean that: the sub-pixels having the same color include the same number of first corner portions, while the sub-pixels having different colors include different total numbers of fourth corner portions due to different numbers of sub-pixels having different colors.

For example, as shown in FIG. 3B and FIG. 6, at least two types of sub-pixels having different colors include different numbers of fourth corner portions 4011, which may help adjust a brightness center in at least part of the display region to obtain a more uniform distribution.

For example, as shown in FIG. 3B, the openings of sub-pixels having a same color have a same area, and the openings of sub-pixels having different colors have different areas.

For example, the opening includes one fourth corner portion 4011, a geometric center of the opening is located on a side of a midpoint of a line 403, which connects a vertex of the first vertex corner 401 and a vertex of a vertex corner opposite to the fourth corner portion 4011, away from the fourth corner portion 4011. By adjusting the geometric centers of at least some light emitting regions, at least some brightness centers in the display region may be adjusted to cause the brightness centers to distribute more uniform.

For example, as shown in FIG. 3B and FIG. 6, in the display substrate provided by embodiments of the present disclosure, the shapes of some sub-pixels may be adjusted so that in at least two types of sub-pixels having different colors among the fourth sub-pixel, the fifth sub-pixel and the sixth sub-pixel, a distance from the geometric center of the light emitting region of the sub-pixel to an intersection point of extension lines of two straight sides connected to both ends of the first corner portion is different from a distance from the geometric center of the light emitting region of the sub-pixel to an intersection point of two straight sides or their extension lines forming the vertex corner opposite to the first corner portion of the light emitting region, so as to adjust an actual brightness center of each dummy pixel unit to obtain a more uniform distribution of actual brightness centers in the display substrate.

For example, the number of fourth corner portions 4011 in a sub-pixel having a color is one, and the number of fourth corner portions 4011 in a sub-pixel having another color is greater than one, and may be, for example, two, three or four. For example, the number of fourth corner portions 4011 in a sub-pixel having a color may be two, and the number of fourth corner portions 4011 in a sub-pixel having another color may be three or four. For example, the number of fourth corner portions 4011 in a sub-pixel having a color may be three, and the number of fourth corner portions 4011 in a sub-pixel having another color may be four. The number of fourth corner portions in sub-pixels having different colors is not limited in embodiments of the present disclosure and may be set according to actual product requirements.

For example, as shown in FIG. 3B and FIG. 6, the fourth corner portion 4011 includes a vertex P, and the vertex P may be on the connecting line 403. A curve (i.e., an outer edge of the first corner portion) is formed by extending two sides connected with two ends of the fourth corner portion 4011 toward the vertex P, and then the fourth corner portion 4011 is a rounded chamfer. In this case, the fourth corner portion 4011 may be in a range of n microns along the outline centered on the vertex P, and a value of n may range from 2 microns to 7 microns. When the first corner portion is a rounded chamfer and the vertex corner opposite to the first corner portion in the shape of the opening is a right angle or an acute angle, a distance from the geometric center O of the opening to the intersection point of the extension lines of the two straight sides connected with the two ends of the first corner portion is greater than a distance from the geometric center O to the intersection point of the extension lines of the two straight sides forming the vertex corner opposite to the first corner portion.

The above-mentioned "rounded chamfer" refers to a vertex corner formed by a curve. The curve may be an arc, or may be an irregular curve such as a curve extracted from an ellipse, a wavy line, and so on. Embodiments of the present disclosure schematically show that the curve has a convex shape with respect to the geometric center O of the opening, but the present disclosure is not limited thereto. The curve may also have a concave shape with respect to the geometric center O of the opening. For example, when the curve is a convex arc, a central angle of the arc may range from 10° to 150°. For example, the central angle of the arc may range from 60° to 120°. For example, the central angle of the arc may be 90°. For example, a curve length of the rounded chamfer included in the fourth corner portion 4011 may range from 10 microns to 60 microns.

For example, the fourth corner portion 4011 is a rounded chamfer, a radius of curvature may range from 5 microns to 20 microns.

For example, as shown in FIG. 3B, the opening 201 of the fourth sub-pixel SP4, the opening 202 of the fifth sub-pixel SP5 and the opening 203 of the sixth sub-pixel SP6 all include the fourth corner portion 4011, and the number of fourth corner portions 4011 in sub-pixels having different colors varies.

In embodiments of the present disclosure, as an example, the sub-pixels having the same color include the same number of first corner portions having the same shape (including parameters such as length and curvature), while the first corner portions in the sub-pixels having different colors have the same shape, but the present disclosure is not limited to this. The first corner portions in the sub-pixels having different colors may have the same or different shapes.

For example, as shown in FIG. 3B, the fourth sub-pixel SP4 includes four first corner portions 1011, the sixth sub-pixel SP6 includes two first corner portions 1011, and the fifth sub-pixel SP5 includes one first corner portion 1011.

FIG. 4 shows a schematic diagram of a partial structure of a display substrate in a first display region according to some exemplary embodiments of the present disclosure, in which a repetitive unit is schematically shown. FIG. 5 schematically shows a pixel arrangement structure in a connection region between a first display region and a second display region. It should be noted that, in embodiments of FIG. 5, the pixel arrangement in the first display region AA1 adopts an implementation shown in FIG. 4, and the pixel arrangement in the second display region AA2 adopts an implementation shown in FIG. 3B. However, embodiments of the present disclosure are not limited thereto. The pixel arrangement in the first display region AA1 according to embodiments of the present disclosure may be used in combination with the pixel arrangement in the second display region AA2 shown in FIG. 3A or FIG. 3B in case of no conflicts.

It should be noted that the sub-pixel in the first display region AA1 may include a first light emitting device. For example, the first light emitting device may include an anode structure, a light emitting layer and a cathode structure that are stacked. It should be noted that, for the sake of clarity, the anode structure of the first light emitting device is used in related figures (e.g., FIG. 4) to schematically show the first light emitting device. For example, in the first display region AA1, the anode structure of the first light emitting device includes an anode body 501 and an anode connection portion 502. An orthographic projection of the anode body 501 on the base substrate 1 may have a regular shape, such as rectangle, rounded rectangle, etc. The first display region AA1 is further provided with a pixel driving circuit (to be described below) for driving the first light emitting device, and the anode connection portion 502 is electrically connected to the pixel driving circuit of the first light emitting device through an anode connection hole 503.

Each sub-pixel in the first display region AA1 may include a first light emitting device 41. For example, the first light emitting device 41 may include an anode structure, a light emitting layer and a cathode structure that are stacked. It should be noted that, for the sake of clarity, the anode structure of the first light emitting device 41 is used to schematically show the first light emitting device 41. For example, the first display region AA1 includes a plurality of first light emitting devices 41 arranged in an array, and the first light emitting devices 41 are used to emit light.

It should be noted that in FIG. 4 and similar figures below, an innermost pattern represents the opening or the light emitting region of a sub-pixel, and an outline which has a larger area than the pattern of the opening or the light emitting region of the sub-pixel and which substantially surrounds the opening is an outline of the anode structure of the sub-pixel, and an outermost outline is an outline of an opening of a sub-pixel in the second display region having the same color as the sub-pixel and corresponding to the sub-pixel.

It should also be noted that, in embodiments of the present disclosure, the light emitting layer may be formed by an evaporation process using a mask. For the sub-pixels having the same color respectively located in the first display region AA1 and the second display region AA2, the openings of the masks may have substantially the same shape and area, which helps to implement a masking process for forming the light emitting layer. In this way, in case of no conflicts, in FIG. 4 and similar figures below, the innermost pattern represents the opening or the light emitting region of a sub-pixel, and an outline which has a larger area than the pattern of the opening or the light emitting region of the sub-pixel and which substantially surrounds the opening is an outline of the anode structure of the sub-pixel, and the outermost outline may be an outline of the light emitting layer of the sub-pixel.

Referring to FIG. 4 and FIG. 5, for the first repetitive unit P1 in the first display region AA1, a pattern of an orthographic projection of the first opening 101 of the first sub-pixel SP1 on the base substrate 1 is in a shape of a droplet, a pattern of an orthographic projection of the second opening 102 of the second sub-pixel SP2 on the base substrate 1 is a circle, and a pattern of an orthographic projection of the third opening 103 of the third sub-pixel SP3 on the base substrate 1 is a circle.

In the first repetitive unit P1, the patterns of the orthographic projections of the first openings 101 of the two first sub-pixels SP1 on the base substrate 1 respectively have a first center 1011 and a third center 1012, and the patterns of the orthographic projections of the second openings 102 of the second sub-pixel SP2 on the base substrate 1 respectively have a second center 1021 and a fourth center 1022. The first center 1011, the second center 1021, the third center 1012 and the fourth center 1022 are connected in sequence to form a first quadrilateral S1, and at least two sides of the first quadrilateral S1 have different lengths. For example, a ratio of a length of one of the at least two sides to a length of another of the at least two sides in the first quadrilateral S1 ranges from 0.8 to 1.2.

As shown in FIG. 4, the first quadrilateral S1 has four sides SL1, SL2, SL3 and SL4. The side SL1 connects the first center 1011 and the second center 1021, the side SL2 connects the second center 1021 and the third center 1012, the side SL3 connects the third center 1012 and the fourth center 1024, and the side SL4 connects the fourth center 1022 and the first center 1011. For example, the length of the side SL1 is substantially equal to the length of the side SL3, the length of the side SL2 is greater than the length of the side SL1 or the length of the side SL3, and the length of the side SL4 is less than the length of the side SL1 or the length of the side SL3. For example, a ratio of the length of the side SL1 to the length of the side SL3 is about 1, a ratio of the length of the side SL2 to the length of the side SL1 or the length of the side SL3 is greater than 1 and less than or equal to 1.2, and a ratio of the length of the side SL4 to the length of the side SL1 or the length of the side SL3 is greater than or equal to 0.8 and less than 1.

Continuing to refer to FIG. 4 and FIG. 5, the first opening 101 of at least one first sub-pixel includes a body portion 101A and an auxiliary portion 101B. An orthographic projection of the body portion 101A of the first opening on the base substrate 1 is a circle. An orthographic projection of the auxiliary portion 101B of the first opening on the base substrate 1 protrudes in the second direction Y relative to the circle.

A pattern of the orthographic projection of the body portion 101A of the first opening on the base substrate 1 has a first center of circle 1013. For the first opening 101 with the first center 1011, the first center 1011 of the first opening is offset by a first offset distance DP1 in the second direction Y relative to the first center of circle 1013 of the body portion of the first opening. For the first opening 101 with the third center 1012, the third center 1012 of the first opening is offset by a second offset distance DP2 in the second direction Y relative to the first center of circle 1013 of the body portion of the first opening.

A ratio of the first offset distance DP1 to the second offset distance DP2 may range from 0.8 to 1.2. For example, the first offset distance DP1 is substantially equal to the second offset distance DP2. For example, at least one of the first offset distance DP1 and the second offset distance DP2 may be in a range of 1 to 5 microns, such as 1 to 3 microns, about 1.2 microns, about 1.5 microns, and so on.

For the first opening 101 with the first center 1011, a line connecting the first center of circle 1013 of the first opening 101 and the second center 1021 is substantially parallel to the first direction X. For the first opening 101 with the third center 1012, a line connecting the first center of circle 1013 of the first opening 101 and the fourth center 1022 is substantially parallel to the first direction X. Referring to FIG. 4 and FIG. 5, for sub-pixels in a same row, the first center of circle 1013 of the first opening 101 and the center of the second opening 102 (that is, the center of circle of the second opening 102) located in the first display region AA1 and the center 2011 of the fourth opening 201 and the center 2021 of the fifth opening 202 located in the second display region AA2 are located on a straight line parallel to the first direction X; the center of the third opening 103 (that is, the center of circle of the third opening 103) located in the first display region AA1 and the center 2031 of the sixth opening 203 located in the second display region AA2 are located on a straight line parallel to the first direction X.

It should be noted that, unless otherwise specified, in embodiments of the present disclosure, the arrangement of the sub-pixels may also be implemented after being rotated by 90°. That is, in some embodiments, for the first opening 101 with the first center 1011, a line connecting the first center of circle 1013 of the first opening 101 and the second center 1021 may be substantially parallel to the second direction Y. For the first opening 101 with the third center 1012, a line connecting the first center of circle 1013 of the first opening 101 and the fourth center 1022 may be substantially parallel to the second direction Y.

Referring to FIG. 4, the line (i.e., the side SL1) connecting the first center 1011 and the second center 1021 forms a first angle with respect to the first direction X, and the first angle is greater than 0° and less than 30°. The line (i.e., the side SL3) connecting the third center 1012 and the fourth center 1022 forms a second angle with respect to the first direction X, and the second angle is greater than 0° and less than 30°. For example, the first angle may be substantially equal to the second angle.

Continuing to refer to FIG. 4, the third sub-pixel SP3 is located in the first quadrilateral S1. It should be noted that "the third sub-pixel SP3 is located in the first quadrilateral S1" here may include that: an orthographic projection of the third opening 103 of the third sub-pixel SP3 on the base substrate 1 falls within the first quadrilateral S1, an orthographic projection of the anode structure of the third sub-pixel SP3 on the base substrate 1 falls within the first quadrilateral S1, an orthographic projection of the light emitting layer of the third sub-pixel SP3 on the base substrate 1 falls within the first quadrilateral S1.

For example, the orthographic projection of at least one third opening 103 on the base substrate 1 falls within the first quadrilateral S1 and has a fifth center 1031. In embodiments shown in FIG. 4, the orthographic projection of the third opening 103 on the base substrate 1 is a circle, and the fifth center 1031 is the center of circle of the third opening 103.

A separation distance (SY1 shown in FIG. 4) between the fifth center 1031 and the first center 1011 in the second direction Y is not equal to a separation distance (SY2 shown in FIG. 4) between the fifth center 1021 and the fourth center 1022 in the second direction Y. For example, the separation distance SY2 may be greater than the separation distance SY1.

A separation distance (SY3 shown in FIG. 4) between the fifth center 1031 and the second center 1021 in the second direction Y is not equal to a separation distance (SY4 shown in FIG. 4) between the fifth center 1021 and the third center 1012 in the second direction Y. For example, the separation distance SY4 may be greater than the separation distance SY3.

Continuing to refer to FIG. 4, in one first repetitive unit P1, patterns of orthographic projections of the third openings 103 of the four third sub-pixels on the base substrate 1 have a fifth center 1031, a sixth center 1032, a seventh center 1033, and an eighth center 1034, respectively. The fifth center 1031, the sixth center 1032, the seventh center 1033 and the eighth center 1034 are connected in sequence to form a second quadrilateral S2. A ratio of a length of one of any two sides among the four sides of the second quadrilateral S2 to a length of the other of the two sides ranges from 0.8 to 1.2. For example, the lengths of the four sides of the second quadrilateral S2 are substantially equal to each other. For example, the second quadrilateral S2 is a square.

In embodiments of the present disclosure, the first sub-pixels SP1 and the second sub-pixels SP2 are adjacent in both the first direction X and the second direction Y, and a distance in the first direction X between the center 1011 of the first opening 101 of a first sub-pixel SP1 and the center 1021 of the second opening 102 of a second sub-pixel SP2 adjacent to the first sub-pixel SP1 in the first direction X is not equal to a distance in the second direction Y between the center 1011 of the first opening of a first sub-pixel and the center 1021 of the second opening of a second sub-pixel adjacent to the first sub-pixel in the second direction Y. For example, referring to FIG. 9A, the distance SD1 in the first direction X between the center 1011 of the first opening 101 of the first sub-pixel SP1 and the center 1021 of the second opening 102 of the second sub-pixel SP2 adjacent to the first sub-pixel SP1 in the first direction X is not equal to the distance SD2 in the second direction Y between the center 1011 of the first opening of a first sub-pixel and the center 1021 of the second opening of a second sub-pixel adjacent to the first sub-pixel in the second direction Y. For example, a ratio of the distance SD1 to the distance SD2 may range from 0.8 to 1, or range from 1 to 1.2.

Figure 9A:
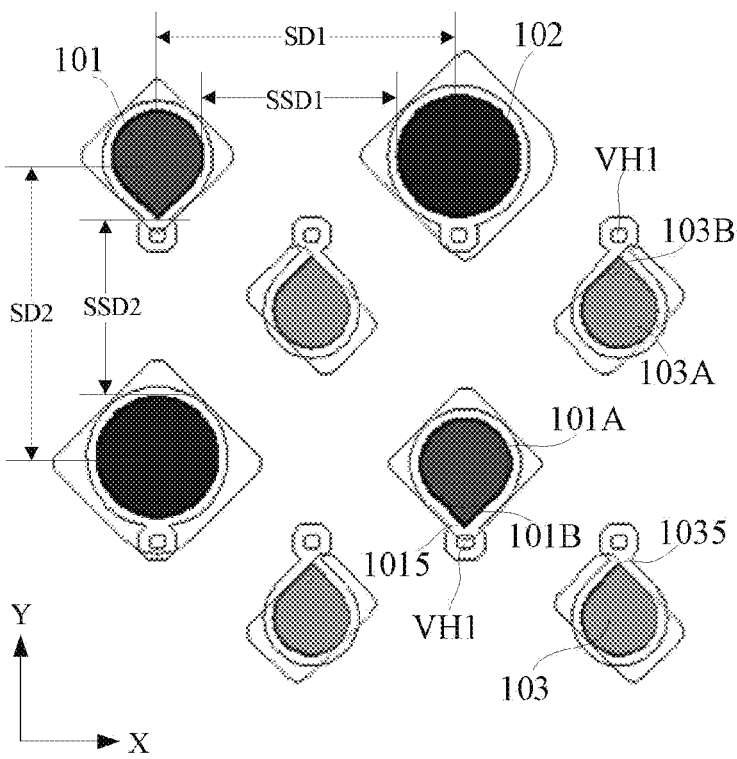
FIG. 9A shows a schematic diagram of a partial structure of a display substrate in a first display region according to some exemplary embodiments of the present disclosure, in which a first repetitive unit is schematically shown.

In embodiments of the present disclosure, for example, referring to FIG. 9A, a minimum distance SSD1 in the first direction X between a boundary of the first opening 101 of the first sub-pixel SP1 and a boundary of the second opening 102 of the second sub-pixel SP2 adjacent to the first sub-pixel SP1 in the first direction X is not equal to a minimum distance SSD2 in the second direction Y between a boundary of the first opening 101 of the first sub-pixel SP1 and a boundary of the second opening 102 of the second sub-pixel SP2 adjacent to the first sub-pixel SP1 in the second direction Y. For example, a ratio of the minimum distance SSD1 to the minimum distance SSD2 may range from 0.8 to 1, or range from 1 to 1.2.

It should be noted that herein, unless otherwise specified, the expression "minimum distance" between A and B means a distance between a feature such as a part, point or corner of A closest to B and a feature such as a part, point or corner of B closest to A. When the "minimum distance" between A and B is not limited by direction, it means a length of a line connecting the feature such as the part, point or corner of A closest to B and the feature such as the part, point or corner of B closest to A. When the "minimum distance" between A and B is limited by a direction, it means a length of the line connecting the feature such as the part, point or corner of A closest to B and the feature such as the part, point or corner of B closest to A in that direction or a length of a projection of the connecting line in that direction.

In embodiments of the present disclosure, for example, a size of the orthographic projection of the opening of at least one of the first sub-pixel, the second sub-pixel or the third sub-pixel on the base substrate in the first direction may be different from a size of the orthographic projection of the opening of at least one of the first sub-pixel, the second sub-pixel or the third sub-pixel on the base substrate in the second direction Y. For example, a ratio of the size of the orthographic projection of the opening of at least one of the first sub-pixel, the second sub-pixel or the third sub-pixel on the base substrate in the first direction X to the size of the orthographic projection in the second direction Y may range from 0.5 to 2.

In embodiments of the present disclosure, the size of the first opening 101 of the first sub-pixel in the first direction X, the size of the second opening 102 of the second sub-pixel in the first direction X, and the size of the third opening 103 of the third sub-pixel in the first direction X may be different from each other. For example, the size of the second opening 102 of the second sub-pixel in the first direction X may be greater than the size of the first opening 101 of the first sub-pixel in the first direction X, for example, a ratio of the two ranges between 5 and 1.2. The size of the first opening 101 of the first sub-pixel in the first direction X may be greater than the size of the third opening 103 of the third sub-pixel in the first direction X, for example, a ratio of the two ranges between 5 and 1.2.

The size of the first opening 101 of the first sub-pixel in the second direction Y, the size of the second opening 102 of the second sub-pixel in the second direction Y, and the size of the third opening 103 of the third sub-pixel in the second direction Y may be different from each other. For example, the size of the second opening 102 of the second sub-pixel in the second direction Y may be greater than the size of the first opening 101 of the first sub-pixel in the second direction Y, for example, a ratio of the two ranges between 5 and 1.2. The size of the first opening 101 of the first sub-pixel in the second direction Y may be greater than the size of the third opening 103 of the third sub-pixel in the second direction Y, for example, a ratio of the two ranges between 5 and 1.2.

In embodiments of the present disclosure, a spacing distance in the first direction X between the first openings 101 of the first sub-pixels adjacent in the first direction X, a spacing distance in the first direction X between the second openings 102 of the second sub-pixels adjacent in the first direction X, and a spacing distance in the first direction X between the third openings 103 of the third sub-pixels adjacent in the first direction X may be different from each other. For example, the spacing distance in the first direction X between the first openings 101 of the first sub-pixels adjacent in the first direction X may be greater than the spacing distance in the first direction X between the second openings 102 of the second sub-pixels adjacent in the first direction X, for example, a ratio of the two ranges between 3 and 1.1. The spacing distance in the first direction X between the second openings 102 of the second sub-pixels adjacent in the first direction X may be greater than the spacing distance in the first direction X between the third openings 103 of the third sub-pixels adjacent in the first direction X, for example, a ratio of the two ranges between 6 and 1.1.

A spacing distance in the second direction Y between the first openings 101 of the first sub-pixels adjacent in the second direction Y, a spacing distance in the second direction Y between the second openings 102 of the second sub-pixels adjacent in the second direction Y, and a spacing distance in the second direction Y between the third openings 103 of the third sub-pixels adjacent in the second direction Y may be different from each other. For example, the spacing distance in the second direction Y between the first openings 101 of the first sub-pixels adjacent in the second direction Y may be greater than the spacing distance in the second direction Y between the second openings 102 of the second sub-pixels adjacent in the second direction Y, for example, a ratio of the two ranges between 3 and 1.1. The spacing distance in the second direction Y between the second openings 102 of the second sub-pixels adjacent in the second direction Y may be greater than the spacing distance in the second direction Y between the third openings 103 of the third sub-pixels adjacent in the second direction Y, for example, a ratio of the two ranges between 6 and 1.1.

FIG. 7 to FIG. 21 respectively show schematic diagrams of a partial structure of a display substrate in a first display region according to some exemplary embodiments of the present disclosure, in which one first repetitive unit is schematically shown.

It should be noted that, in embodiments of the present disclosure, a sub-pixel having a certain color is illustrated by way of example in describing a shape, a protruding direction and other characteristics of the opening of the sub-pixel in the first repetitive unit. In case of no conflicts, the shape, the protruding direction and other characteristics of the opening of the sub-pixel in the first repetitive unit may be applied to sub-pixels having other colors, such as the red sub-pixel, the blue sub-pixel and the green sub-pixel. In case of no conflicts, the various technical means described with respect to FIG. 4 and FIG. 7 to FIG. 21 may be freely combined.

It should also be noted that in the following descriptions, features and differences in each embodiment that are not described above will be mainly described, and for the same parts of each embodiment, reference may be made to the foregoing description of the embodiment.

Figure 7:
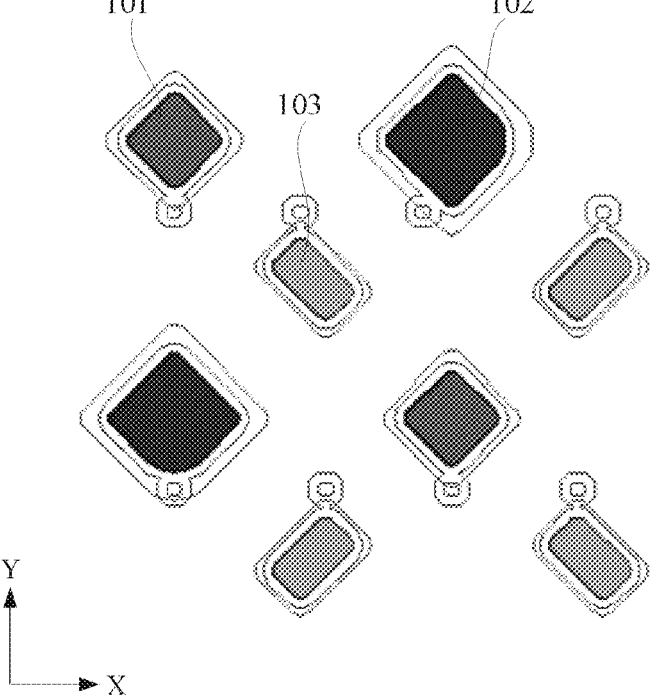
FIG. 7 and FIG. 8 respectively show schematic diagrams of a partial structure of a display substrate in a first display region according to some exemplary embodiments of the present disclosure, in which a first repetitive unit is schematically shown.

As shown in FIG. 7, the sub-pixels in the first repetitive unit P1 may be reduced in proportion to the sub-pixels in the second repetitive unit P2 shown in FIG. 3B. For example, the first opening 101 of the first sub-pixel SP1 has the same shape as the fourth opening 201 of the fourth sub-pixel SP4, and an area of the orthographic projection of the first opening 101 on the base substrate 1 is less than an area of the orthographic projection of the fourth opening 201 on the base substrate 1. For example, the area of the orthographic projection of the first opening 101 on the base substrate 1 may be 40% to 80%, for example, about 50%, of the area of the orthographic projection of the fourth opening 201 on the base substrate 1. The second opening 102 of the second sub-pixel SP2 has the same shape as the fifth opening 202 of the fifth sub-pixel SP5, and an area of the orthographic projection of the second opening 102 on the base substrate 1 is less than an area of the orthographic projection of the fifth opening 202 on the base substrate 1. For example, the area of the orthographic projection of the second opening 102 on the base substrate 1 may be 40% to 80%, for example, about 50%, of the area of the orthographic projection of the fifth opening 202 on the base substrate 1. The third opening 103 of the third sub-pixel SP3 has the same shape as the sixth opening 203 of the sixth sub-pixel SP6, and an area of the orthographic projection of the third opening 103 on the base substrate 1 is less than an area of the orthographic projection of the sixth opening 203 on the base substrate 1. For example, the area of the orthographic projection of the third opening 103 on the base substrate 1 may be 40% to 80%, for example, about 50%, of the area of the orthographic projection of the sixth opening 203 on the base substrate 1.

Figure 8:
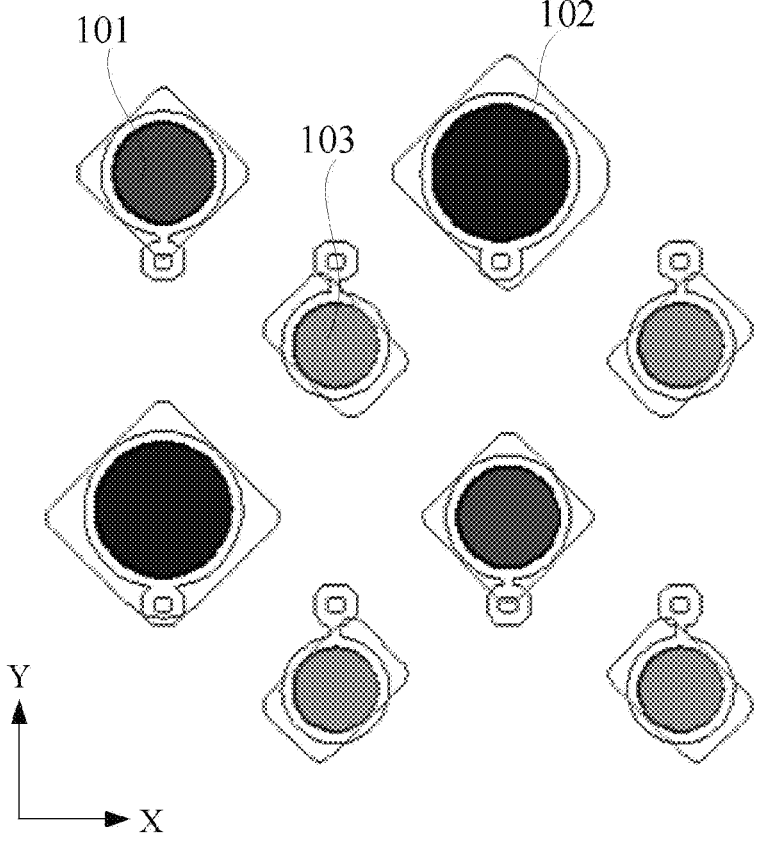

As shown in FIG. 8, the orthographic projection of the opening of each sub-pixel in the first repetitive unit P1 on the base substrate 1 has a circular shape. For example, the orthographic projection of the first opening 101 of the first sub-pixel SP1 on the base substrate 1, the orthographic projection of the second opening 102 of the second sub-pixel SP2 on the base substrate 1, and the orthographic projection of the third opening 103 of the third sub-pixel SP3 on the base substrate 1 each has a circular shape. For example, the area of the orthographic projection of the first opening 101 on the base substrate 1 may be 40% to 80% of the area of the orthographic projection of the fourth opening 201 on the base substrate 1. The area of the orthographic projection of the second opening 102 on the base substrate 1 may be 40% to 80% of the area of the orthographic projection of the fifth opening 202 on the base substrate 1. The area of the orthographic projection of the third opening 103 on the base substrate 1 may be 40% to 80% of the area of the orthographic projection of the sixth opening 203 on the base substrate 1.

Referring to FIG. 9A, the orthographic projection of the first opening 101 on the base substrate 1 and the orthographic projection of the third opening 103 on the base substrate 1 each has a shape of a droplet. For example, the third opening 103 of at least one third sub-pixel includes a body portion 103A and an auxiliary portion 103B, an orthographic projection of the body portion 103A of the third opening on the base substrate 1 is a circle, and an orthographic projection of the auxiliary portion 103B of the third opening on the base substrate 1 protrudes in the second direction Y relative to the circle of the body portion 103A of the third opening.

Referring to FIG. 4 and FIG. 9A, the orthographic projection of the auxiliary portion 101B of the first opening 101 on the base substrate 1 protrudes, relative to the circle of the body portion 101A of the first opening 101, toward an orthographic projection of an anode connection hole VH1 of the first sub-pixel where the first opening 101 is located on the base substrate 1. The orthographic projection of the auxiliary portion 103B of the third opening 103 on the base substrate 1 protrudes, relative to the circle of the body portion 103A of the third opening 103, toward an orthographic projection of an anode connection hole VH1 of the third sub-pixel where the third opening 103 is located on the base substrate 1.

For example, the auxiliary portion 101B of the first opening 101 has a sharp corner portion on a side facing the anode connection hole VH1 of the first sub-pixel. The auxiliary portion 103B of the third opening 103 has a sharp corner portion on a side facing the anode connection hole VH1 of the third sub-pixel.

Figure 10A:
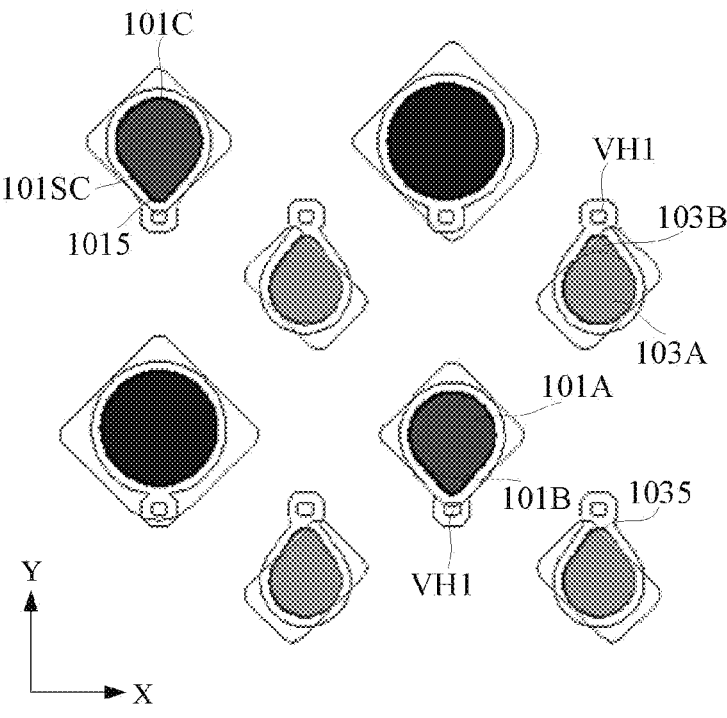
FIG. 10A shows a schematic diagram of a partial structure of a display substrate in a first display region according to some exemplary embodiments of the present disclosure, in which a first repetitive unit is schematically shown.

Referring to FIG. 10A, the auxiliary portion 101B of the first opening 101 has a rounded corner portion on the side facing the anode connection hole VH1 of the first sub-pixel. The auxiliary portion 103B of the third opening 103 has a rounded corner portion on the side facing the anode connection hole VH1 of the third sub-pixel.

For example, a radius of curvature of the rounded corner portion ranges from 1 micron to 10 microns.

In other words, in embodiments of the present disclosure, the auxiliary portion 101B of the first opening 101 has a first corner portion 1015 on the side facing the anode connection hole VH1 of the first sub-pixel. The auxiliary portion 103B of the third opening 103 has a third corner portion 1035 on the side facing the anode connection hole VH1 of the third sub-pixel.

For example, the first corner portion 1015 may be a sharp corner or a rounded corner, and the third corner portion 1035 may be a sharp corner or a rounded corner.

Figure 9B:
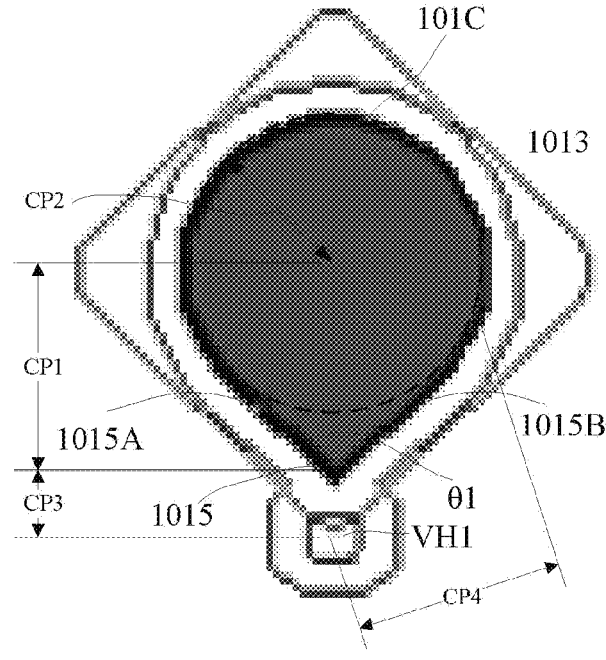
FIG. 9B shows a schematic diagram of a shape of an opening in FIG. 9A.
Figure 10B:
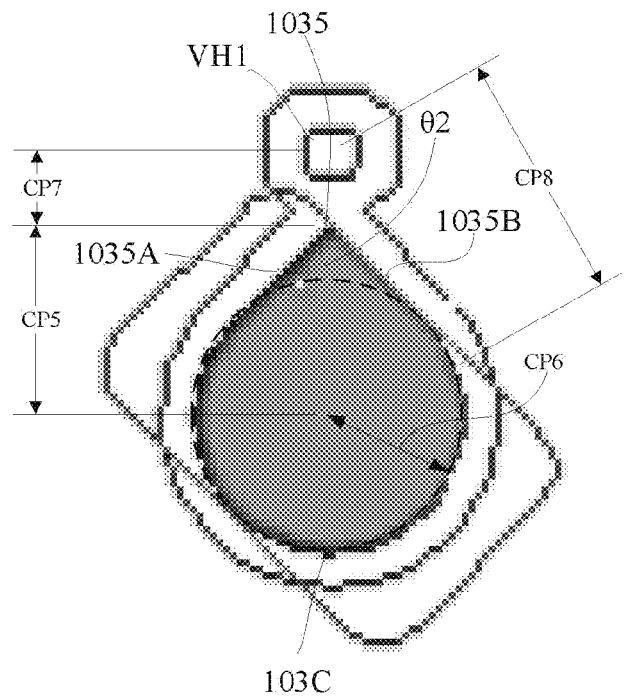
FIG. 10B shows a schematic diagram of a shape of an opening in FIG. 10A.

Referring to FIG. 9B and FIG. 10B, the orthographic projection of the body portion 101A of the first opening 101 on the base substrate includes a first arc 101C. An orthographic projection of the first corner portion 1015 on the base substrate includes a first side 1015A and a second side 1015B. The first side 1015A and the second side 1015B are respectively connected to the first arc 101C and are tangent to the first arc 101C at corresponding connecting points. An angle $\theta 1$ formed between the first side 1015A and the second side 1015B ranges from 10° to 170°, for example, 10° to 90°, about 60°, etc.

The orthographic projection of the body portion 103A of the third opening 103 on the base substrate includes a third arc 103C. An orthographic projection of the third corner portion 1035 on the base substrate includes a first side 1035A and a second side 1035B. The first side 1035A of the third corner portion and the second side 1035B of the third corner portion are respectively connected to the third arc 103C and are tangent to the third arc 103C at corresponding connecting points. An angle $\theta 2$ formed between the first side 1035A of the third corner portion and the second side 1035B of the third corner portion ranges from 10° to 170°, for example, 10° to 90°, about 60°, etc.

Referring to FIG. 4 and FIG. 7 to FIG. 10A, the line connecting the first center 1011 and the fourth center 1022 is substantially parallel to the second direction Y; and/or, the line connecting the second center 1012 and the third center 1021 is substantially parallel to the second direction Y.

For example, referring to FIG. 9A, FIG. 10A, FIG. 13 and FIG. 14, an outline of the pattern of the orthographic projection of the first opening 101 of the first sub-pixel SP1 on the base substrate and/or an outline of the pattern of the orthographic projection of the second opening 102 of the second sub-pixel SP2 on the base substrate include/includes an arc. The pattern of the orthographic projection of the first opening 101 of the first sub-pixel SP1 on the base substrate and/or the pattern of the orthographic projection of the second opening 102 of the second sub-pixel SP2 on the base substrate are/is axisymmetric in one of the first direction X and the second direction Y, and is non-axisymmetric in the other of the first direction X and the second direction Y. For example, as shown in FIG. 9A, the pattern of the orthographic projection of the first opening 101 of the first sub-pixel SP1 on the base substrate is axisymmetric in the second direction Y and non-axisymmetric in the first direction X.

For example, the outline of the pattern of the orthographic projection of the first opening 101 of the first sub-pixel SP1 on the base substrate and/or the outline of the pattern of the orthographic projection of the second opening 102 of the second sub-pixel SP2 on the base substrate include/includes an arc portion and a non-arc portion, the arc portion has a same center of circle, and a total length of the non-arc portion is less than a total length of the arc portion. For example, as shown in FIG. 10A, the outline of the pattern of the orthographic projection of the first opening 101 of the first sub-pixel SP1 on the base substrate includes an arc portion 101C and a non-arc portion 101SC, the arc portion 101C have a same center of circle 1013, and the total length of the non-arc portion 101SC is less than the total length of the arc portion 101C. For example, a ratio of the total length of the non-arc portion 101SC to the total length of the arc portion 101C ranges from 1 to 3 or from 1 to 4.

For example, referring to FIG. 9B and FIG. 10B, the first opening 101 has a first outline, and the first outline has a first boundary portion (such as the outline of the first corner portion 1015). A distance CP1 between the first boundary portion 1015 and the first center of circle 1013 of the body portion of the first opening is greater than a distance CP2 between other parts of the first outline and the first center of circle 1013 of the body portion of the first opening, and a distance CP3 between the first boundary portion and the center of the anode connection hole VH1 of the first sub-pixel where the first opening is located is less than a distance CP4 between other parts of the first outline and the center of the anode connection hole VH1 of the first sub-pixel where the first opening is located.

For example, in embodiments shown in FIG. 9B, the first opening 101 has a shape of a droplet. The first boundary portion may include a portion tangent to the arc portion 101C between two endpoints in the boundary of the first outline of the first opening, or in other words, the first boundary portion may be represented by the non-arc portion 101SC.

The third opening 103 has a third outline, and the third outline has a third boundary portion (for example, the outline of the third corner portion 1035). A distance CP5 between the third boundary portion 1035 and the third center of circle 1033 of the body portion of the third opening is greater than a distance CP6 between other parts of the third outline and the third center of circle 1033 of the body portion of the third opening, and a distance CP7 between the third boundary portion and the center of the anode connection hole VH1 of the third sub-pixel where the third opening is located is less than a distance CP8 between other parts of the third outline and the center of the anode connection hole VH1 of the third sub-pixel where the third opening is located.

Figure 11:
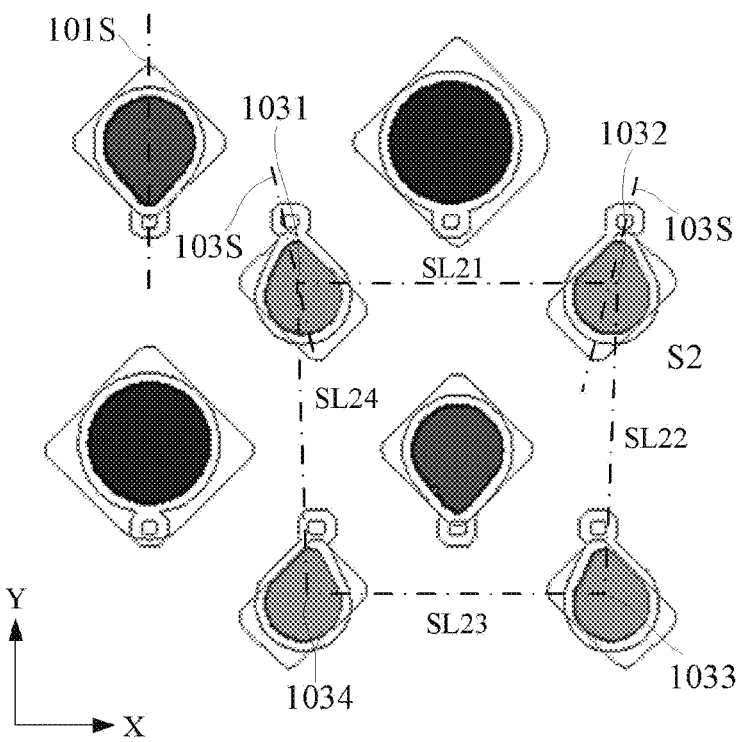
FIG. 11 to FIG. 21 respectively show schematic diagrams of a partial structure of a display substrate in a first display region according to some exemplary embodiments of the present disclosure, in which a first repetitive unit is schematically shown.

Referring to FIG. 11, in one first repetitive unit P1, patterns of orthographic projections of the third openings 103 of the four third sub-pixels SP3 on the base substrate 1 respectively have a fifth center 1031, a sixth center 1032, a seventh center 1033, and an eighth center 1034. The fifth center 1031, the sixth center 1032, the seventh center 1033 and the eighth center 1034 are connected in sequence to form a second quadrilateral S2. At least two sides of the second quadrilateral S2 have different lengths, for example, a ratio of the lengths of at least two sides of the second quadrilateral S2 ranges from 0.8 to 1.2. For example, the second quadrilateral S2 includes four sides SL21, SL22, SL23 and SL24. The side SL21 connects the fifth center 1031 and the sixth center 1032, the side SL22 connects the sixth center 1032 and the seventh center 1033, the side SL23 connects the seventh center 1033 and the eighth center 1034, and the side SL24 connects the eighth center 1034 and the fifth center 1031.

For example, the length of the side SL22 may be equal to the length of the side SL24, the length of the side SL21 may be greater than the length of the side SL22 or the length of the side SL24, and the length of the side SL23 may be less than the length of the side SL22 or the length of the side SL24.

For example, the second quadrilateral S2 is an isosceles trapezoid. In embodiments of the present disclosure, the first quadrilateral S1 and/or the second quadrilateral S2 may be selected from at least one of a parallelogram or an isosceles trapezoid.

In embodiments of the present disclosure, the pattern of the orthographic projection of at least one first opening 101 on the base substrate 1 has a first axis of symmetry 101S substantially parallel to the second direction Y.

Referring to FIG. 11, the pattern of the orthographic projection of at least one third opening 103 on the base substrate 1 has a third axis of symmetry 103S, and the third axis of symmetry 103S of the at least one third opening is deflected by a predetermined deflection angle relative to the second direction Y.

For two third openings 103 adjacent in the first direction X in a first repetitive unit P1, a deflection direction of the third axis of symmetry 103S of one third opening 103 relative to the second direction Y is opposite to a deflection direction of the third axis of symmetry 103S of the other third opening 103 relative to the second direction Y. For example, in embodiments shown in FIG. 11, for the two third openings 103 in the second row, the third axis of symmetry 103S of the third opening 103 on a left side is deflected to the left relative to the second direction Y, and the third axis of symmetry 103S of the third opening 103 on a right side is deflected to the right relative to the second direction Y.

For two third openings 103 adjacent in the second direction Y in a first repetitive unit P1, the deflection direction of the third axis of symmetry 103S of one third opening 103 relative to the second direction Y is opposite to the deflection direction of the third axis of symmetry 103S of the other third opening 103 relative to the second direction Y. For example, in embodiments shown in FIG. 11, for the two third openings 103 in the second column, the third axis of symmetry 103S of the third opening 103 on an upper side is deflected to the left relative to the second direction Y, and the third axis of symmetry 103S of the third opening 103 on a lower side is deflected to the right relative to the second direction Y.

For two third openings 103 adjacent in the first direction X in a first repetitive unit P1, a deflection angle of the third axis of symmetry 103S of one third opening 103 relative to the second direction Y is substantially equal to a deflection angle of the third axis of symmetry 103S of the other third opening 103 relative to the second direction Y. For example, a ratio of the deflection angle of the third axis of symmetry 103S of one third opening 103 relative to the second direction Y to the deflection angle of the third axis of symmetry 103S of the other third opening 103 relative to the second direction Y ranges from 0.8 to 1.2.

For two third openings 103 adjacent in the second direction Y in a first repetitive unit P1, the deflection angle of the third axis of symmetry 103S of one third opening 103 relative to the second direction Y is substantially equal to the deflection angle of the third axis of symmetry 103S of the other third opening 103 relative to the second direction Y. For example, a ratio of the deflection angle of the third axis of symmetry 103S of one third opening 103 relative to the second direction Y to the deflection angle of the third axis of symmetry 103S of the other third opening 103 relative to the second direction Y ranges from 0.8 to 1.2.

For example, the predetermined deflection angle ranges from 1° to 70°. For example, the above-mentioned deflection angle may range from 30° to 60°, for example, about 45°.

Figure 12:
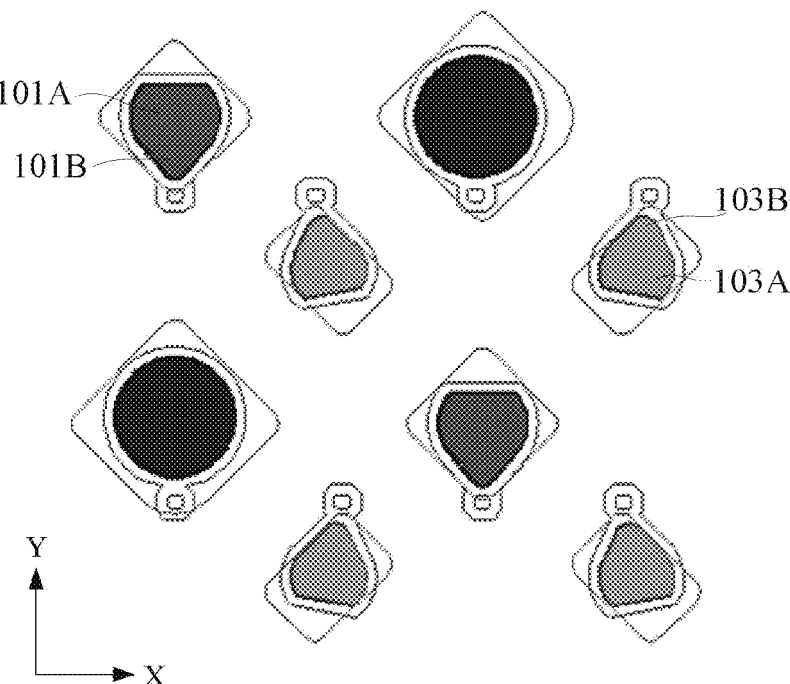

Referring to FIG. 12, the first opening 101 of at least one first sub-pixel includes a body portion 101A and an auxiliary portion 101B. The orthographic projection of the body portion 101A of the first opening on the base substrate 1 is a major circle. The orthographic projection of the auxiliary portion 101B of the first opening on the base substrate 1 protrudes in the second direction Y relative to the major circle.

It should be noted that herein, the expression "major circle" corresponds to "major arc", and the major circle may be understood as a pattern surrounded by a major arc and a chord.

It should also be noted that, in embodiments of the present disclosure, a line connecting two endpoints of an arc may be a straight line or a curve, and may be partially concave or convex relative to the body portion of the opening.

The third opening 103 of at least one third sub-pixel includes a body portion 103A and an auxiliary portion 103B. The orthographic projection of the body portion 103A of the third opening on the base substrate 1 is a major circle, and the orthographic projection of the auxiliary portion 103B of the third opening on the base substrate 1 protrudes in the second direction Y relative to the major circle.

In other words, different from embodiments shown in FIG. 11, in embodiments shown in FIG. 12, a part of the circle of the body portion of the first opening 101 is cut off, and a part of the circle of the body portion of the third opening 103 is cut off.

Figure 13:
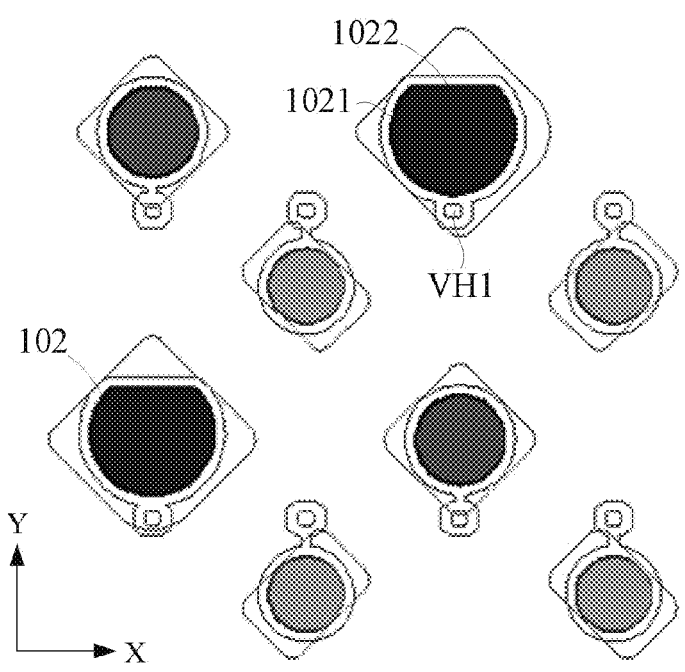
Figure 14:
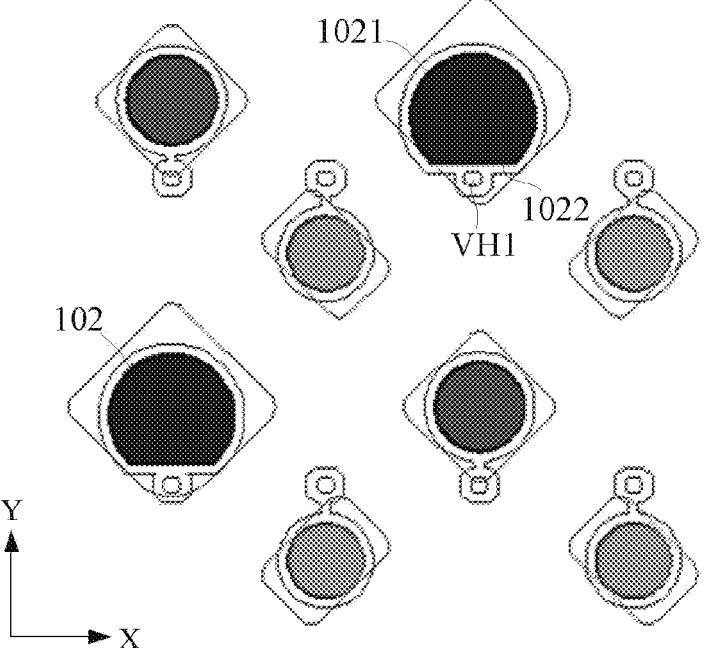

Referring to FIG. 13 and FIG. 14, the orthographic projection of the second opening 102 of at least one second sub-pixel on the base substrate 1 is a major circle. That is, different from embodiments shown in FIG. 8, in embodiments shown in FIG. 13 and FIG. 14, a part of the circle of the second opening 102 is cut off.

Referring to FIG. 13, the outline of the orthographic projection of the second opening 102 of at least one second sub-pixel on the base substrate 1 includes a second major arc 1021 and a second chord 1022. The second chord 1022 and the anode connection hole VH1 of the second sub-pixel where the second opening is located are respectively located on opposite sides of the second major arc 1021.

Referring to FIG. 14, the outline of the orthographic projection of the second opening 102 of at least one second sub-pixel on the base substrate 1 includes a second major arc 1021 and a second chord 1022. The second chord 1022 and the anode connection hole VH1 of the second sub-pixel where the second opening is located are located on a same side of the second major arc 1021.

Figure 15:
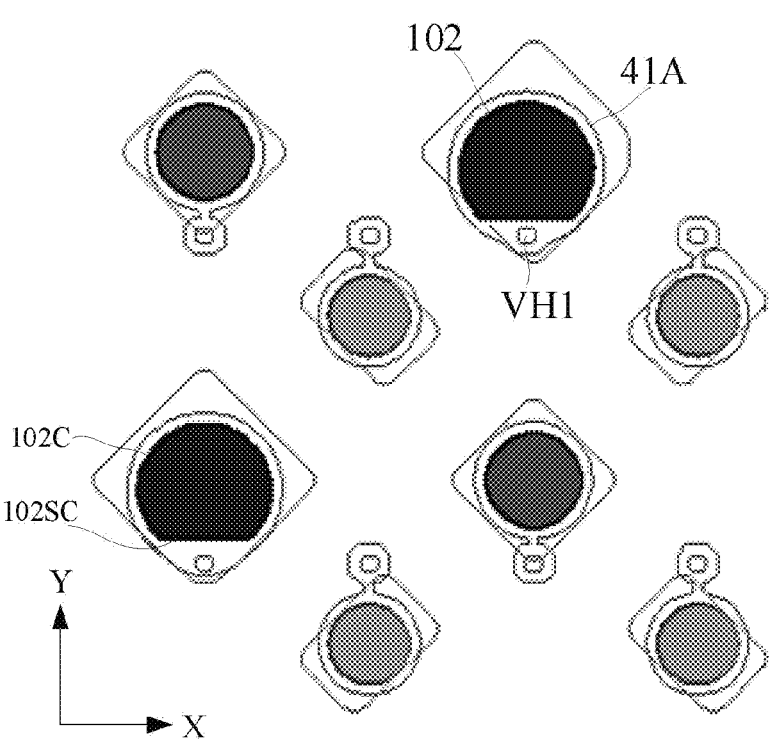

Referring to FIG. 15, the orthographic projection of the second opening 102 of the second sub-pixel on the base substrate 1 and the orthographic projection of the anode connection hole VH1 of the second sub-pixel on the base substrate 1 are both located within the orthographic projection of the anode structure 41A of the second sub-pixel on the base substrate 1, and the orthographic projection of the anode structure 41A of the second sub-pixel on the base substrate 1 is substantially a circle.

Figure 16:
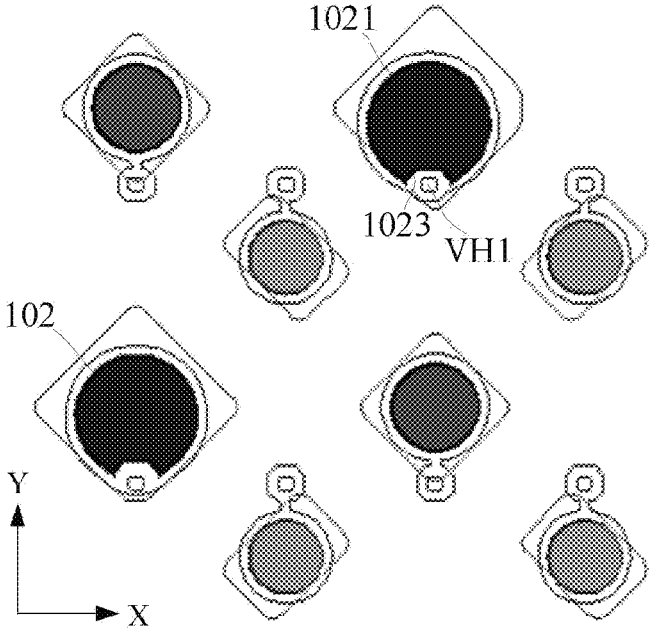

Referring to FIG. 16, the outline of the orthographic projection of the second opening 102 of at least one second sub-pixel on the base substrate 1 includes a second major arc 1021 and a second outline side 1023, and the second outline side includes a plurality of sub-sides at least partially surrounding the orthographic projection of the anode connection hole VH1 of the second sub-pixel on the base substrate 1.

Figure 17:
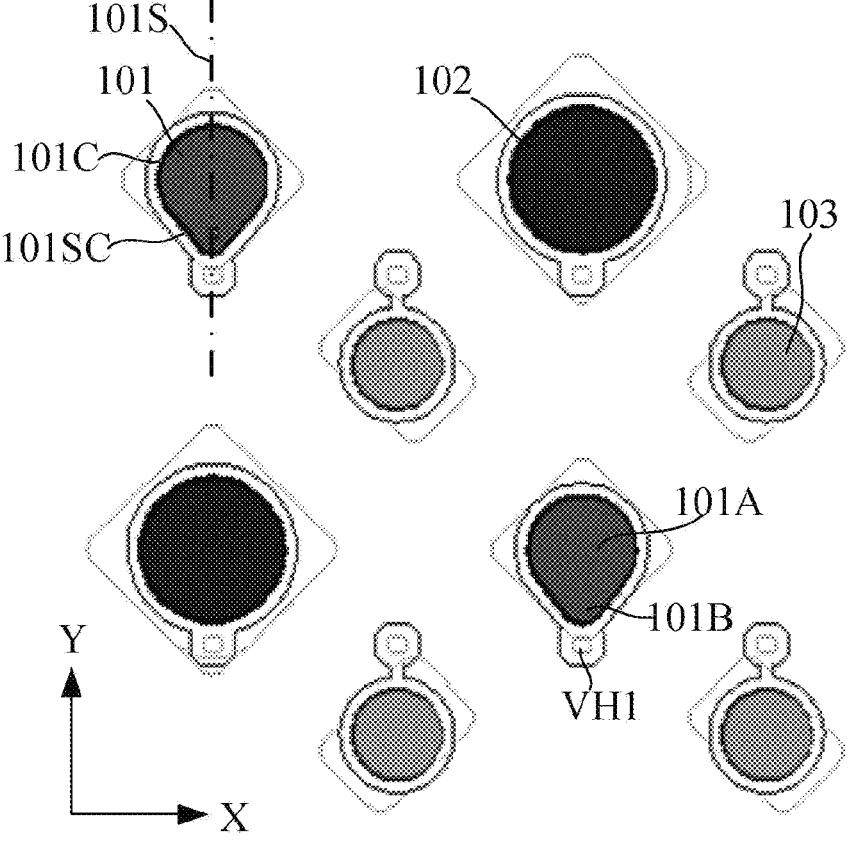
Figure 18:
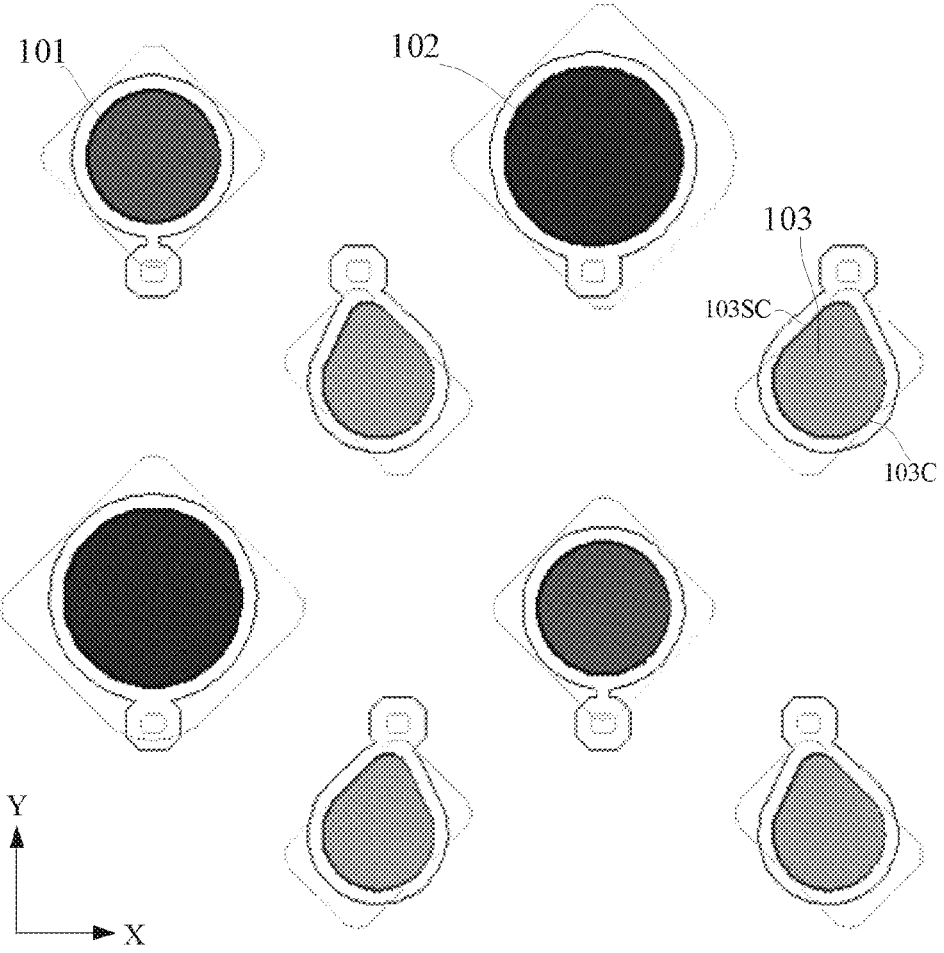

Referring to FIG. 17, similar to embodiments shown in FIG. 4, for the first repetitive unit P1 in the first display region AA1, the pattern of the orthographic projection of the first opening 101 of the first sub-pixel SP1 on the base substrate 1 has a shape of a droplet, the pattern of the orthographic projection of the second opening 102 of the second sub-pixel SP2 on the base substrate 1 has a circular shape, and the pattern of the orthographic projection of the third opening 103 of the third sub-pixel SP3 on the base substrate has a circular shape.

For example, the orthographic projection of the fifth opening 202 of the fifth sub-pixel on the base substrate 1 has a shape of a rhombus. For the second sub-pixel SP2 and the fifth sub-pixel SP5 in a same row, the center of the second opening 102 of the second sub-pixel SP2 and the center of the fifth opening 202 of the fifth sub-pixel SP5 are located on a straight line parallel to the first direction X. For the second sub-pixel SP2 and the fifth sub-pixel SP5 in a same column, the center of the second opening 102 of the second sub-pixel SP2 and the center of the fifth opening 202 of the fifth sub-pixel SP5 are located on a straight line parallel to the second direction Y.

In embodiments shown in FIG. 17, each of the orthographic projection of the second opening 102 of the second sub-pixel on the base substrate and the orthographic projection of the third opening 103 of the third sub-pixel on the base substrate has a circular shape.

The first opening 101 of the first sub-pixel includes a body portion 101A and an auxiliary portion 101B. The orthographic projection of the body portion 101A of the first opening on the base substrate is a circle, and the orthographic projection of the auxiliary portion 101B of the first opening on the base substrate protrudes, relative to the circle of the body portion 101A of the first opening, toward the orthographic projection of the anode connection hole VH1 of the first sub-pixel where the first opening is located on the base substrate.

The pattern of the orthographic projection of the first opening 101 of the first sub-pixel on the base substrate has a first axis of symmetry 101S substantially parallel to the second direction Y.

Referring to 18, the orthographic projection of the third opening 103 of the third sub-pixel SP3 on the base substrate 1 has a shape of a droplet, and the orthographic projections of the first opening 101 and the second opening 102 on the base substrate 1 have a circular shape. Similar to FIG. 11, the third opening 103 of the third sub-pixel SP3 is deflected by a predetermined deflection angle relative to the second direction Y.

Figure 19:
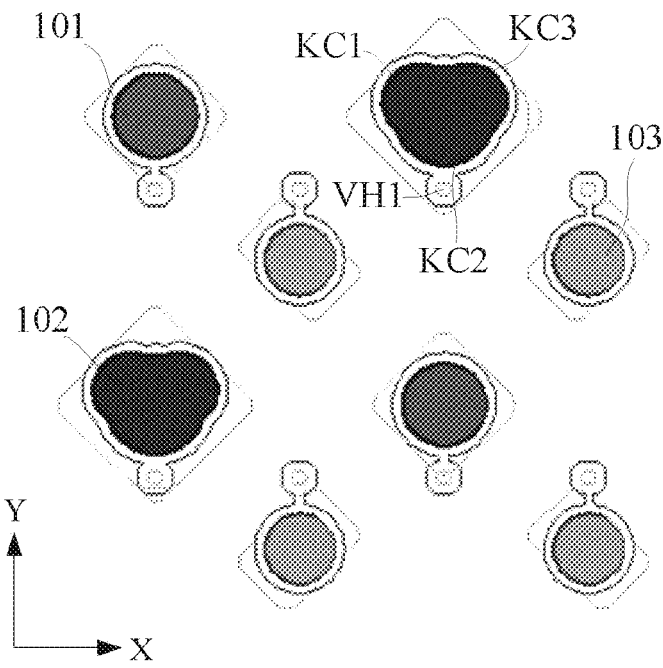
Figure 20:
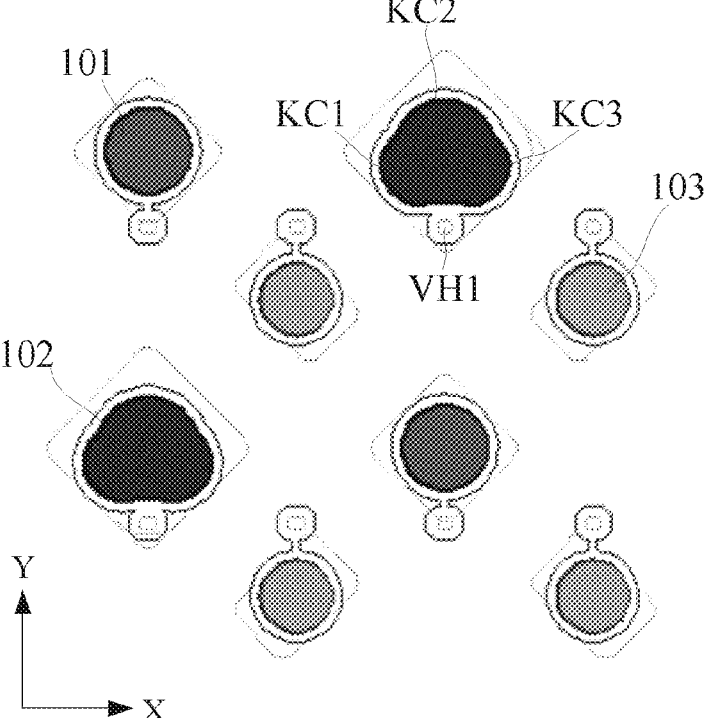

Referring to FIG. 19 and FIG. 20, the outline of the orthographic projection of the second opening 102 on the base substrate 1 includes a plurality of arc segments, for example, a first arc segment KC1, a second arc segment KC2 and a third arc segment KC3. The second arc segment KC2 is located between the first arc segment KC1 and the third arc segment KC3 to connect the first arc segment KC1 and the third arc segment KC3. The first arc segment KC1 and the third arc segment KC3 may have substantially the same radius of curvature, and the second arc segment KC2 may have a radius of curvature different from that of the first arc segment KC1 and the third arc segment KC3. The first arc segment KC1 and the third arc segment KC3 are spaced apart from each other and are not directly connected.

As shown in FIG. 19, the first arc segment KC1 and the third arc segment KC3 are located on a side of the second arc segment KC2 away from the anode connection hole VH1.

As shown in FIG. 20, the first arc segment KC1 and the third arc segment KC3 are located on a side of the second arc segment KC2 facing the anode connection hole VH1.

Figure 21:
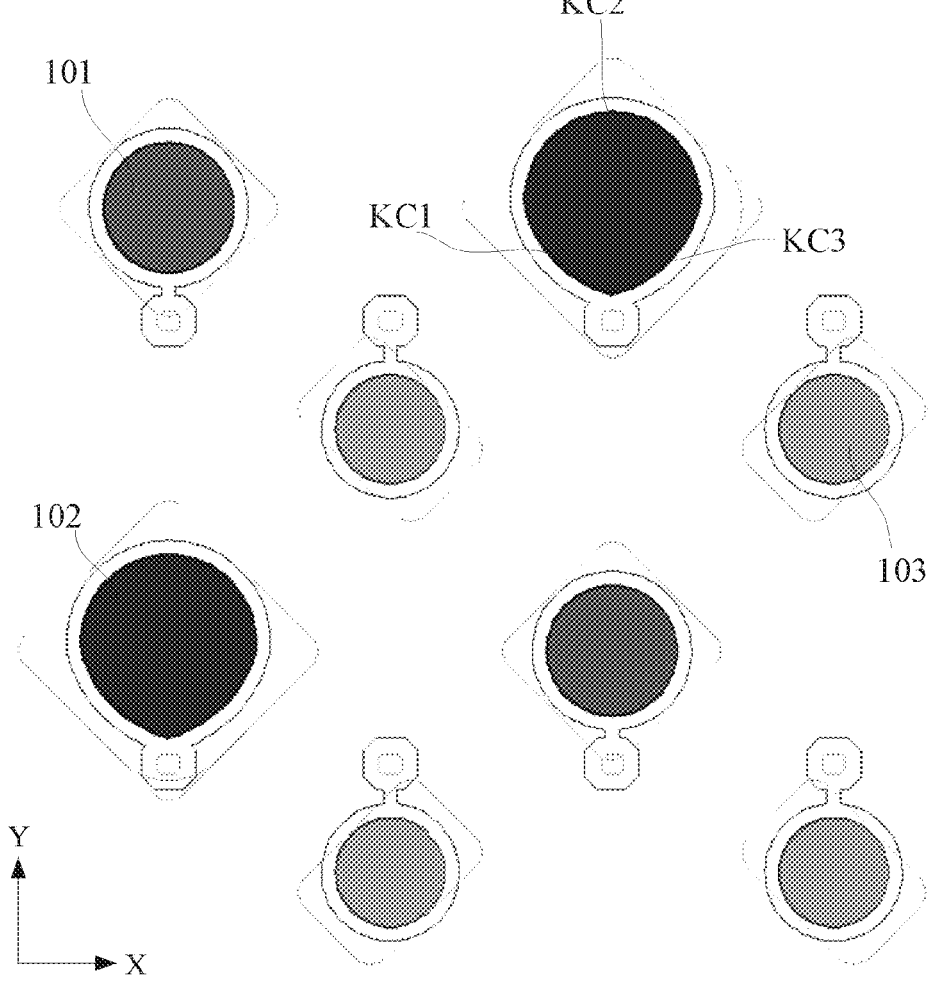

Referring to FIG. 21, the outline of the orthographic projection of the second opening 102 on the base substrate 1 includes a plurality of arc segments, for example, a first arc segment KC1, a second arc segment KC2 and a third arc segment KC3. The second arc segment KC2 is located between the first arc segment KC1 and the third arc segment KC3 to connect the first arc segment KC1 and the third arc segment KC3. The first arc segment KC1 and the third arc segment KC3 are directly connected. The first arc segment KC1 and the third arc segment KC3 may have substantially the same radius of curvature, and the second arc segment KC2 may have a radius of curvature different from that of the first arc segment KC1 and the third arc segment KC3.

In embodiments shown in FIG. 19 to FIG. 21, by designing the shape of the second opening 102, the separation distance between the second opening 102 and the adjacent third opening 103 may be increased, which is convenient for a placement of a spacer.

In embodiments of the present disclosure, at least one of the first sub-pixel SP1, the second sub-pixel SP2, or the third sub-pixel SP3 includes a first-type sub-pixel 1001, a second-type sub-pixel 1002, a third-type sub-pixel 1003, and a fourth-type sub-pixel 1004. For different types of sub-pixels, protruding vertexes of the droplet-shaped openings protrude in different directions relative to body portions of respective circles. For example, the protruding vertexes of the openings in different types of sub-pixels may have different orientations.

For example, various types of sub-pixels have the same shape or the same area. For example, various types of sub-pixels have the same shape and the same area. For example, the numbers of different types of sub-pixels are substantially the same. For example, for the first-type sub-pixel, the second-type sub-pixel, the third-type sub-pixel and the fourth-type sub-pixel, a ratio of the number of one type of any two types of sub-pixels to the number of the other type of any two types of sub-pixels is 0.8 to 1.2. For example, the ratio of the number of the first-type sub-pixels to the number of the second-type sub-pixels is 0.8 to 1.2, and the ratio of the number of the third-type sub-pixels to the number of the fourth-type sub-pixels is 0.8 to 1.2.

Figure 22:
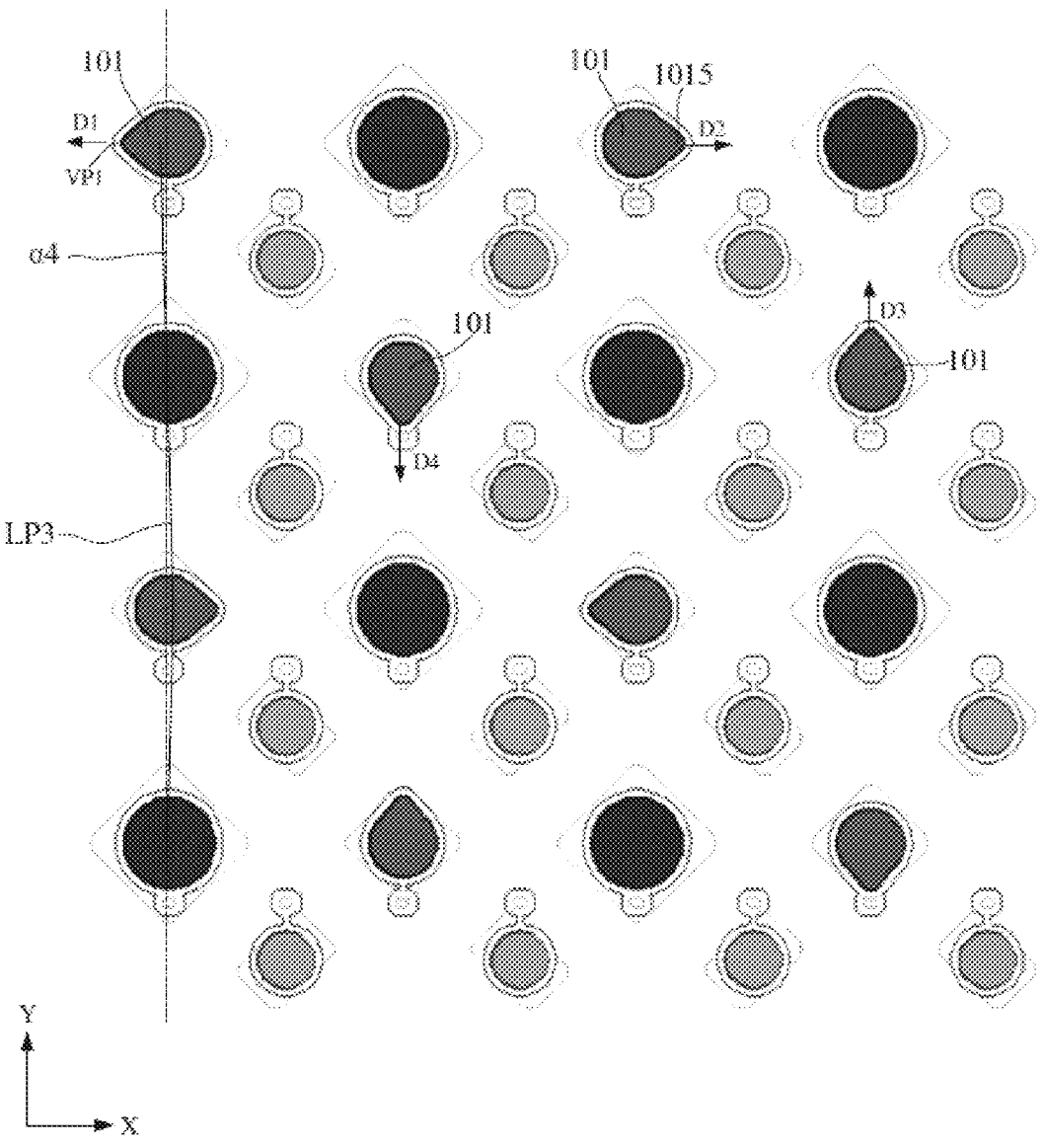
FIG. 22 shows a schematic diagram of a partial structure of a display substrate in a first display region according to some exemplary embodiments of the present disclosure, in which a pixel arrangement structure of a plurality of repetitive units in the first display region is schematically shown.

As shown in FIG. 22, for the first-type sub-pixel 1001, the second-type sub-pixel 1002, the third-type sub-pixel 1003 and the fourth-type sub-pixel 1004, the protruding vertexes VP1 of the first openings 101 protrude toward a direction D1, a direction D2, a direction D3 and a direction D4, respectively. For example, in the first opening 101 of the first-type sub-pixel 1001, the protruding vertex VP1 protrudes toward the direction D1; in the first opening 101 of the second-type sub-pixel 1002, the protruding vertex VP1 protrudes toward the direction D2; in the first opening 101 of the third-type sub-pixel 1003, the protruding vertex VP1 protrudes toward the direction D3; in the first opening 101 of the fourth-type sub-pixel 1004, the protruding vertex VP1 protrudes toward the direction D4.

As shown in FIG. 22, the direction D1 is opposite to the direction D2, and the direction D3 is opposite to the direction D4.

For example, as shown in FIG. 22, in one first repetitive unit P1, at least two first corner portions 1015 have different orientations. For example, one first corner portion 1015 faces left and the other corner portion 1015 faces down. That is, one corner portion faces the first direction X, and the other corner portion faces the second direction Y. For another example, in one first repetitive unit P1, at least two third corner portions 1035 may also have different orientations.

In the display substrate provided by embodiments of the present disclosure, a color shift problem during the display of the display substrate may be alleviated by providing four different types of sub-pixels.

In addition, generally, in a display substrate, for the sub-pixels having different colors, four vertex corners included in the opening have the same shape. Different from such display substrate, the display substrate provided by embodiments of the present disclosure is provided with the above-mentioned four different types of sub-pixels, which may help to reduce the graininess during the display of the display substrate.

In the above-mentioned embodiments, at least one of the orthographic projection of the opening of the first sub-pixel on the base substrate, the orthographic projection of the opening of the second sub-pixel on the base substrate, or the orthographic projection of the opening of the third sub-pixel on the base substrate has a shape of a droplet, but embodiments of the present disclosure are not limited thereto. At least one of the pattern of the orthographic projection of the opening of the first sub-pixel on the base substrate, the pattern of the orthographic projection of the opening of the second sub-pixel on the base substrate, or the pattern of the orthographic projection of the opening of the third sub-pixel on the base substrate may include a curve, a wavy line, a zigzag line, a small notch, a small protrusion, and other shapes.

In embodiments of the present disclosure, for example, the outline of the pattern of the orthographic projection of the first opening 101 of the first sub-pixel on the base substrate includes an arc portion 101C and a non-arc portion 101SC. A first distance between the arc portion 101C of the first opening and the boundary of the anode structure 41A of the first sub-pixel at each position in a radial direction thereof is substantially the same, and a second distance between the non-arc portion 101SC of the first opening to the boundary of the anode structure 41A of the first sub-pixel in the radial direction thereof may not be equal to the first distance.

For example, the outline of the pattern of the orthographic projection of the second opening 102 of the second sub-pixel on the base substrate includes an arc portion 102C and a non-arc portion 102SC. A third distance between the arc portion 102C of the second opening and the boundary of the anode structure 41A of the second sub-pixel at each position in the radial direction thereof is substantially the same, and a fourth distance between the non-arc portion 102SC of the second opening and the boundary of the anode structure 41A of the second sub-pixel in the radial direction thereof is not equal to the third distance.

For example, the outline of the pattern of the orthographic projection of the third opening 103 of the third sub-pixel on the base substrate includes an arc portion 103C and a non-arc portion 103SC. A fifth distance between the arc portion 103C of the third opening and the boundary of the anode structure 41A of the third sub-pixel at each position in the radial direction thereof is substantially the same, and a sixth distance between the non-arc portion 103SC of the third opening and the boundary of the anode structure 41A of the third sub-pixel in the radial direction thereof is not equal to the fifth distance.

For example, the second distance is greater than the first distance, the fourth distance is greater than the third distance, and the sixth distance is greater than the fifth distance.

For another example, a seventh distance between the arc portion 101C of the first opening and the boundary of the light emitting layer 41B of the first sub-pixel at each position in the radial direction thereof is substantially the same, and an eighth distance between the non-arc portion 101SC of the first opening and the boundary of the light emitting layer 41B of the first sub-pixel in the radial direction thereof is not equal to the seventh distance.

A ninth distance between the arc portion 102C of the second opening and the boundary of the light emitting layer 41B of the second sub-pixel at each position in the radial direction thereof is substantially the same, and a tenth distance between the non-arc portion 102SC of the second opening and the boundary of the light emitting layer 41B of the second sub-pixel in the radial direction thereof is not equal to the ninth distance.

An eleventh distance between the arc portion 103C of the third opening and the boundary of the light emitting layer 41B of the third sub-pixel at each position in the radial direction thereof is substantially the same, and a twelfth distance between the non-arc portion 103SC of the third opening and the boundary of the light emitting layer 41B of the third sub-pixel in the radial direction thereof is not equal to the eleventh distance.

Figure 23:
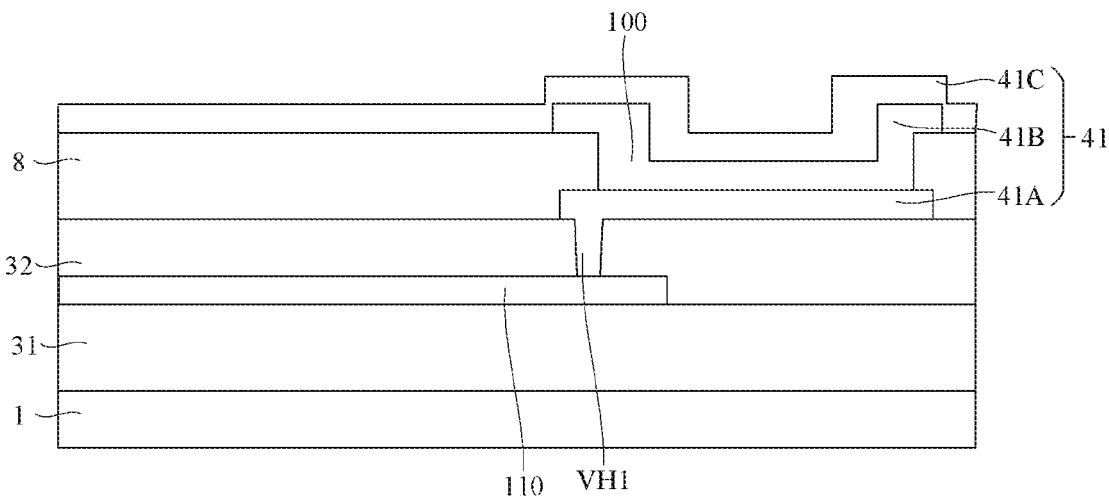
FIG. 23 shows a schematic cross-sectional view taken along line BB' in FIG. 4.

FIG. 23 shows a cross-sectional view taken along line BB' in FIG. 4. Referring to FIG. 23, the display substrate 10 includes an insulating layer 31, a first connection line 110, a planarization layer 32 and a first light emitting device 41 sequentially stacked on the base substrate 1. The first light emitting device 41 includes an anode structure 41A, a cathode structure 41C, and a light emitting layer 41B between the anode structure 41A and the cathode structure 41C. The anode structure 41A of the first light emitting device 41 is electrically connected to the first connection line 110 through an anode connection hole VH1 passing through the planarization layer 32.

It should be noted that herein, for ease of description, a light emitting device in the first display region AA1 is referred to as a first light emitting device. Accordingly, a circuit for driving the first light emitting device to emit light is referred to as a first pixel driving circuit. A light emitting device in the second display region AA2 is referred to as a second light emitting device. Accordingly, a circuit for driving the second light emitting device to emit light is referred to as a second pixel driving circuit.

For example, the first light emitting devices 41 are electrically connected to the first pixel driving circuits respectively, and the plurality of first pixel driving circuits are used to drive the plurality of first light emitting devices 41 respectively. That is, one first pixel driving circuit may drive one corresponding first light emitting device 41, and different first pixel driving circuits may drive different first light emitting devices 41.

In embodiments of the present disclosure, the pixel driving circuits for driving the sub-pixels in the first display region AA1 are not located in the first display region AA1, but are provided in the second display region AA2. For example, the anode structure of the first light emitting device 41 is electrically connected to a first end of the first connection line 110 in the ITO layer through a via hole. An orthographic projection of the first light emitting device 41 on the base substrate 1 is spaced apart from an orthographic projection of the first pixel driving circuit on the base substrate 1. In this way, a coverage area of a metal or opaque pattern in the first display region AA1 may be reduced, and the light transmittance of the first display region AA1 may be increased, so that the light transmittance of the first display region AA1 may be greater than that of the second display region AA2.

For example, the display substrate further includes a plurality of first connection lines on the base substrate 1 and in the ITO layer. The first connection line includes a first end in the first display region 11 and a second end in the second display region AA2, that is, the first connection line extends from the first display region 11 to the second display region AA2.

The first end of the first connection line is electrically connected to the anode structure of the first light emitting device 41 of a sub-pixel, and the second end of the first connection line is electrically connected to the first pixel driving circuit. The first connection line is used to transmit an electrical signal provided by the first pixel driving circuit to the anode structure of the first light emitting device 41, so as to drive the first light emitting device 41 to emit light.

The second display region AA2 further includes at least one (for example, a plurality of) second light emitting devices and at least one (for example, a plurality of) second pixel driving circuits. The second light emitting devices are electrically connected to the second pixel driving circuits respectively, and the second pixel driving circuits are used to drive the second light emitting devices to emit light.

In embodiments of the present disclosure, the pixel driving circuits for driving the sub-pixels in the second display region AA2 are located in the second display region AA2. For example, an orthographic projection of the second light emitting device on the base substrate 1 overlaps at least partially with an orthographic projection of the second pixel driving circuit on the base substrate 1, which may help an electrical connection between the light emitting devices in the second display region AA2 and the corresponding second pixel driving circuits.

In embodiments of the present disclosure, the first pixel driving circuits and the second pixel driving circuits may be arranged in an array in the first direction X and the second direction Y.

The pixel driving circuit may include a semiconductor layer, a first insulating layer, a first gate layer, a second insulating layer, a second gate layer, an interlayer insulating layer, a source/drain metal layer, and so on. In some embodiments, the pixel driving circuit may include seven thin film transistors (for example, a driving transistor, a data writing transistor, a compensation transistor, a reset transistor, a light emission control transistor, etc.), and a storage capacitor. At least one thin film transistor, such as the light emission control transistor, is directly connected to the light emitting device.

It should be noted that herein, unless otherwise specified, the "via hole" or "connection hole" is used to electrically connect components located in different conductive layers. In embodiments of the present disclosure, the "via hole" or "connection hole" may also take other alternative forms. For example, the via hole or connection hole may be replaced by a "groove" for electrically connecting components located in different conductive layers.

For example, the anode structure 41A may contain a transparent conductive material such as ITO. A specific material of the anode structure 41A is not limited in embodiments of the present disclosure. For example, the cathode structure 41C may be a structure formed on an entire surface of the display substrate 10 (for example, at least completely covering the entire display region), and the cathode structure 41C may contain lithium (Li), aluminum (Al), magnesium (Mg), silver (Ag) and other metal materials. For example, since the cathode structure 41C may be formed as a very thin layer, it has good light transmittance.

Figure 24:
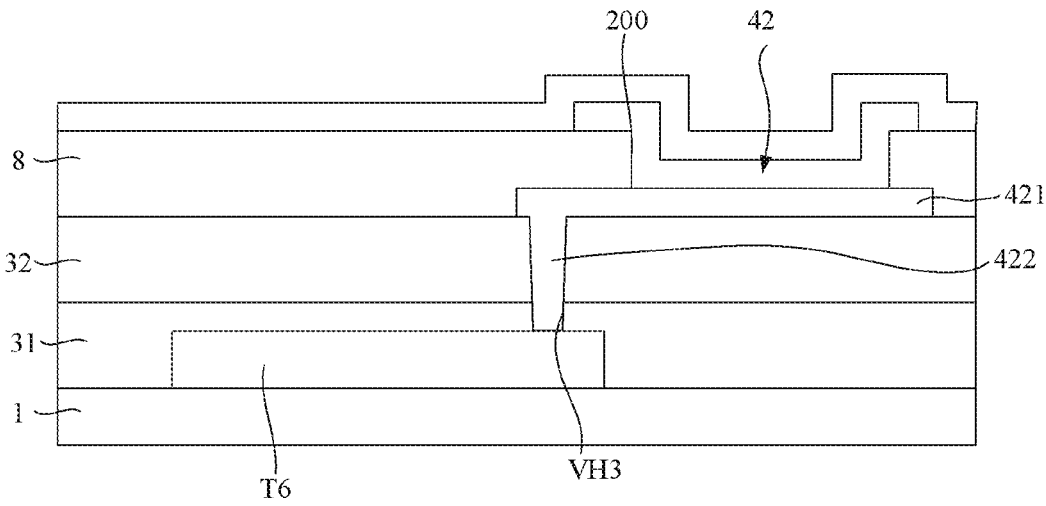
FIG. 24 shows a schematic cross-sectional view taken along line CC' of FIG. 3A.

FIG. 24 shows a schematic cross-sectional view taken along line CC' in FIG. 3A. Referring to FIG. 23 to FIG. 24 in combination, the display substrate 10 may further include a pixel defining layer 8. For example, the pixel defining layer 8 may include a plurality of openings. For example, some openings are located in the first display region AA1, and each opening exposes a part of the anode structure of the first light emitting device 41. Some openings are located in the second display region AA2, and each opening exposes a part of the anode structure of the second light emitting device 42.

The anode structure of the second light emitting device 42 includes an anode body 421 and an anode connection portion 422, and at least part of the anode connection portion 422 has a thickness different from a thickness of the anode body 421.

At a via hole VH3, the anode connection portion 422 of the second light emitting device 42 is connected to a source electrode or a drain electrode of the thin film transistor below (described in more detail below), so at least part of the anode connection portion 422 has a thickness greater than the thickness of the anode body 421.

Figure 25:
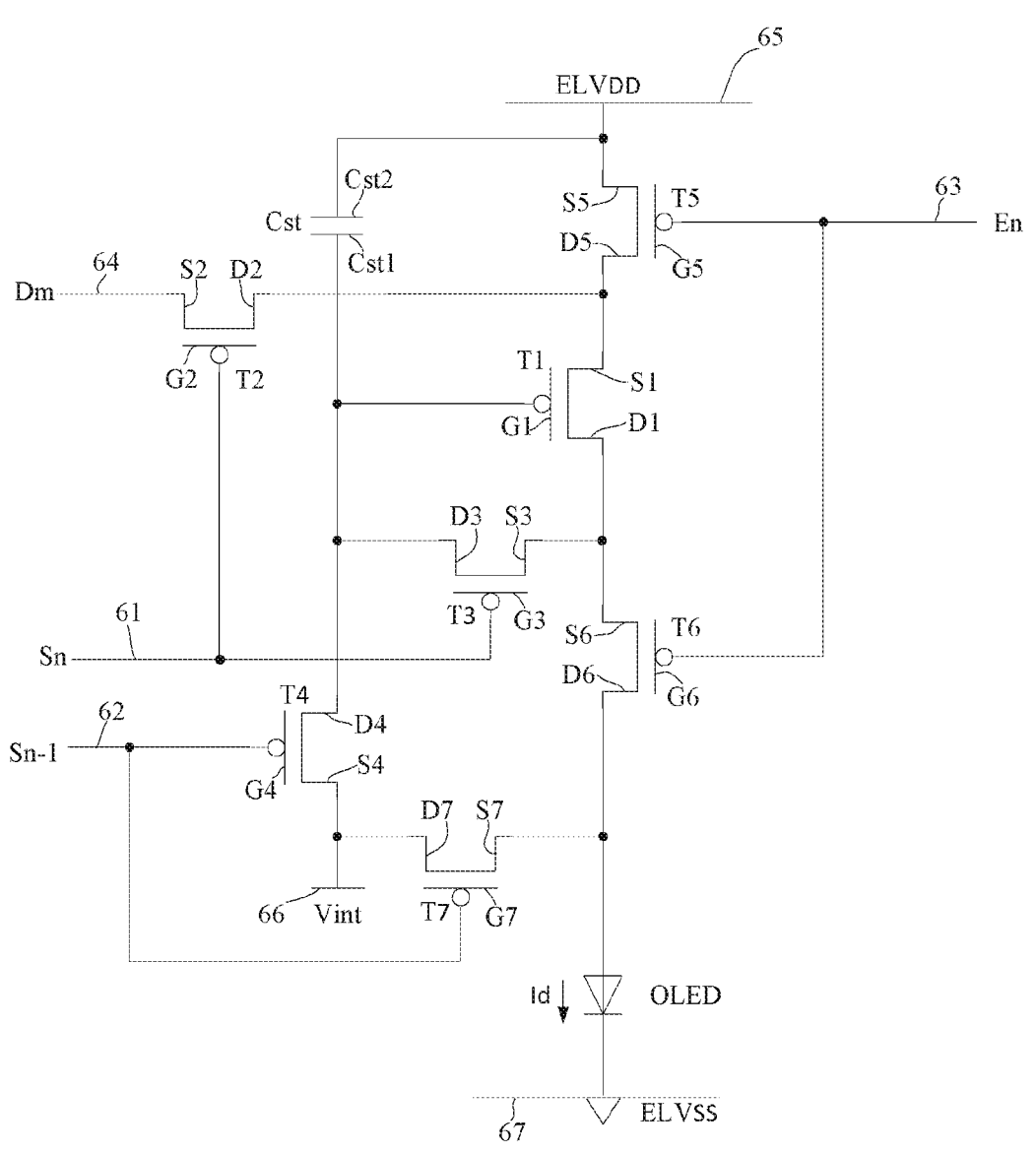
FIG. 25 shows an equivalent circuit diagram of a pixel driving circuit of a display substrate according to some exemplary embodiments of the present disclosure.

FIG. 25 shows an equivalent circuit diagram of a pixel driving circuit of a display substrate according to some exemplary embodiments of the present disclosure.

Hereinafter, a 7T1C pixel driving circuit is illustrated by way of example in describing a structure of the pixel driving circuit in detail. However, embodiments of the present disclosure are not limited to the 7T1C pixel driving circuit. In case of no conflicts, any other known pixel driving circuit structures may be applied to embodiments of the present disclosure.

As shown in FIG. 24 and FIG. 25, the pixel driving circuit may include a plurality of thin film transistors and a storage capacitor Cst. The pixel driving circuit is used to drive an organic light emitting diode (that is, OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include: a scan signal line 61 for transmitting a scan signal Sn, a reset signal line 62 for transmitting a reset control signal RESET (that is, a scan signal for a previous row), a light emission control line 63 for transmitting a light emission control signal En, a data line 64 for transmitting a data signal Dm, a driving voltage line 65 for transmitting a driving voltage VDD, an initialization voltage line 66 for transmitting an initialization voltage Vint, and a power line 67 for transmitting a VSS voltage.

The first transistor T1 has a gate electrode G1 electrically connected to one terminal Cst1 of the storage capacitor Cst, a source electrode S1 electrically connected to the driving voltage line 65 through the fifth transistor T5, and a drain electrode D1 electrically connected to an anode electrode of the OLED through the sixth transistor T6. The first transistor T1 may receive the data signal Dm according to a switching operation of the second transistor T2, so as to supply a driving current Id to the OLED.

The second transistor T2 has a gate electrode G2 electrically connected to the scan signal line 61, a source electrode S2 electrically connected to the data line 64, and a drain electrode D2 electrically connected to the driving voltage line 65 through the fifth transistor T5 and also electrically connected to the source electrode S1 of the first transistor T1. The second transistor T2 may be turned on according to the scan signal Sn transmitted through the scan signal line 61, so that a switching operation is performed to transmit the data signal Dm transmitted to the data line 64 to the source electrode S1 of the first transistor T1.

The third transistor T3 has a gate electrode G3 electrically connected to the scan signal line 61, a source electrode S3 electrically connected to the anode electrode of the OLED via the sixth transistor T6 and also electrically connected to the drain electrode D1 of the first transistor T1, and a drain electrode D3 electrically connected to one terminal Cst1 (that is, a first capacitor electrode) of the storage capacitor Cst, a drain electrode D4 of the fourth transistor T4 and the gate electrode G1 of the first transistor T1. The third transistor T3 may be turned on according to the scan signal Sn transmitted through the scan signal line 61 so as to connect the gate electrode G1 and the drain electrode D1 of the first transistor T1, so that a diode connection of the first transistor T1 is achieved.

The fourth transistor T4 has a gate electrode G4 electrically connected to the reset control signal line 62, a source electrode S4 electrically connected to the initialization voltage line 66, and a drain electrode D4 electrically connected to the terminal Cst1 of the storage capacitor Cst, the drain electrode D3 of the third transistor T3 and the gate electrode G1 of the first transistor T1. The fourth transistor T4 may be turned on according to the reset control signal Sn-1 transmitted through the reset control signal line 62 so as to transmit the initialization voltage Vint to the gate electrode G1 of the first transistor T1, so that an initialization operation is performed to initialize the voltage of the gate electrode G1 of the first transistor T1.

The fifth transistor T5 has a gate electrode G5 electrically connected to the light emission control line 63, a source electrode S5 electrically connected to the driving voltage line 65, and a drain electrode D5 electrically connected to the source electrode S1 of the first transistor T1 and the drain electrode D2 of the second transistor T2.

The sixth transistor T6 has a gate electrode G6 electrically connected to the light emission control line 63, a source electrode S6 electrically connected to the drain electrode D1 of the first transistor D1 and also electrically connected to the source electrode S3 of the third transistor T3, and a drain electrode D6 electrically connected to the anode electrode of the OLED. The fifth transistor T5 and the sixth transistor T6 may be turned on concurrently (for example, simultaneously) according to the light emission control signal En transmitted through the light emission control line 63 so as to transmit the driving voltage ELVDD to the OLED, thereby allowing the driving current Id to flow into the OLED.

The seventh transistor T7 includes a gate electrode G7 connected to the reset control signal line 62, a source electrode S7 connected to the drain electrode D6 of the sixth transistor T6 and the anode electrode of the OLED, and a drain electrode D7 connected to the initialization voltage line 66. The seventh transistor T7 may transmit the reset control signal Sn-1 from the reset control signal line 62 to the gate electrode G7.

The other terminal Cst2 of the storage capacitor Cst is electrically connected to the driving voltage line 65, and the cathode electrode of the OLED is electrically connected to the power line 67 to receive the common voltage ELVSS. Accordingly, the OLED may receive the driving current Id from the first transistor T1 to emit light, so as to display an image.

It should be noted that in FIG. 25, each of the thin film transistors T1, T2, T3, T4, T5, T6 and T7 is a p-channel field effect transistor. However, embodiments of the present disclosure are not limited thereto. At least some of the thin film transistors T1, T2, T3, T4, T5, T6 and T7 may be n-channel field effect transistors.

During operation, in an initialization stage, the reset control signal Sn-1 being at a low level is supplied through the reset control signal line 62. Subsequently, the initialization thin film transistor T4 is turned on based on the reset control signal Sn-1 being at a low level, and the initialization voltage Vint from the initialization voltage line 66 is transmitted to the gate electrode G1 of the driving thin film transistor T1 through the initialization thin film transistor T4. Then, the driving thin film transistor T1 is initialized due to the initialization voltage Vint.

In a data programming stage, the scan signal Sn being at a low level is supplied through the scan signal line 61. Subsequently, the switching thin film transistor T2 and the compensation thin film transistor T3 are turned on based on the scan signal Sn being at a low level. Then, the driving thin film transistor T1 is placed in a diode connection state by the turned-on compensation thin film transistor T3 and is biased in a forward direction.

Subsequently, a compensation voltage Dm+Vth (for example, Vth is a negative value) obtained by subtracting a threshold voltage Vth of the driving thin film transistor T1 from the data signal Dm supplied via the data line 64 is applied to the gate electrode G1 of the driving thin film transistor T1. Then, the driving voltage ELVDD and the compensation voltage Dm+Vth are applied to both terminals of the storage capacitor Cst, so that an electric charge corresponding to a voltage difference between the corresponding terminals is stored in the storage capacitor Cst.

In a light emission stage, the light emission control signal En from the light emission control line 63 changes from being at a high level to being at a low level. Subsequently, in the light emission stage, the first light emission control thin film transistor T5 and the second light emission control thin film transistor T6 are turned on based on the light emission control signal En being at a low level.

Subsequently, a driving current is generated based on a difference between the voltage of the gate electrode G1 of the driving thin film transistor T1 and the driving voltage ELVDD. The driving current Id corresponding to the difference between the driving current and a bypass current is supplied to the OLED through the second light emission control thin film transistor T6.

In the light emission stage, based on a current-voltage relationship of the driving thin film transistor T1, a gate-source voltage of the driving thin film transistor T1 is maintained at (Dm+Vth)-ELVDD due to the storage capacitor Cst. The driving current Id is proportional to (Dm-ELVDD)$^2$. Therefore, the driving current Id may not be affected by a variation of the threshold voltage Vth of the driving thin film transistor T1.

For example, in various embodiments of the present disclosure, the base substrate 1 may be a glass substrate, a quartz substrate, a metal substrate, or a resin substrate, etc., and may be a rigid substrate or a flexible substrate, which is not limited in embodiments of the present disclosure.

Referring back to FIG. 1 and FIG. 2, at least some embodiments of the present disclosure further provide a display device. The display device may include the display substrate as described above and a sensor 2 (for example, a camera).

As described above, the display substrate includes a first display region AA1 and a second display region AA2, and a pixel density of the first display region AA1 is less than that of the second display region AA2. The sensor 2 is located on a side of the base substrate 1 away from the pixel array, and a photosensitive surface of the sensor 2 faces the display substrate. An orthographic projection of the sensor 2 on the base substrate 1 overlaps with the orthographic projection of the first display region AA1 on the base substrate 1, for example, the orthographic projection of the sensor 2 on the base substrate 1 falls with the orthographic projection of the first display region AA1 on the base substrate 1. In this way, the light passing through the first display region AA1 may be used for imaging, thereby achieving the function of under-screen camera.

The sensor 2 may have a structure known in the art, for example, including a complementary metal oxide semiconductor (CMOS) image sensor or a charge coupled device (CCD) image sensor. The sensor 2 may be electrically connected to an image processor. In addition to the image sensor, the imaging module including the image sensor may further include, for example, a lens assembly, in order to achieve a better imaging effect. The lens assembly and the image sensor may be arranged sequentially along an optical axis of the lens assembly in a direction perpendicular to the base substrate 1.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate comprising a first display region, wherein the display substrate comprises:
   a base substrate;
   a first pixel structure in the first display region, wherein the first pixel structure comprises two first sub-pixels and two second sub-pixels; and
   a pixel defining layer on the base substrate, wherein the pixel defining layer comprises a first opening and a second opening in the first display region, wherein the first sub-pixel comprises the first opening, and the second sub-pixel comprises the second opening, and wherein in the first pixel structure, patterns of orthographic projections of the first openings of the two first sub-pixels on the base substrate have a first center and a third center, respectively, and patterns of orthographic projections of the second openings of the two second sub-pixels on the base substrate have a second center and a fourth center, respectively, and the first center, the second center, the third center and the fourth center are connected in sequence to form a first quadrilateral, at least two sides of the first quadrilateral have lengths not equal to each other, and a ratio of a length of one of the at least two sides to a length of another of the at least two sides ranges from 0.8 to 1.2.

2. The display substrate according to claim 1, wherein the first pixel structure further comprises a third sub-pixel, and at least one third sub-pixel is located within the first quadrilateral.

3. The display substrate according to claim 1, wherein the first pixel structure further comprises a plurality of third sub-pixels arranged in an array in a first direction and a second direction, and wherein the pixel defining layer further comprises a plurality of third openings in the first display region, and the third sub-pixel comprises the third opening, and wherein the third opening of at least one third sub-pixel is located within the first quadrilateral, a projection of the third opening of the third sub-pixel in the first direction does not overlap with each of a projection of the first opening of the first sub-pixel in the first direction and a projection of the second opening of the second sub-pixel in the first direction, and a projection of the third opening of the third sub-pixel in the second direction does not overlap with each of a projection of the first opening of the first sub-pixel in the second direction and a projection of the second opening of the second sub-pixel in the second direction.

4. The display substrate according to claim 1, wherein in the first pixel structure, the first sub-pixels and the second sub-pixels are adjacent to each other in both the first direction and the second direction, and a distance in the first direction between a center of a first opening of a first sub-pixel and a center of a second opening of a second sub-pixel adjacent to the first sub-pixel in the first direction is not equal to a distance in the second direction between a center of a first opening of a first sub-pixel and a center of a second opening of a second sub-pixel adjacent to the first sub-pixel in the second direction.

5. The display substrate according to claim 1, wherein in the first pixel structure, the first sub-pixels and the second sub-pixels are adjacent to each other in both the first direction and the second direction, and a minimum distance in the first direction between a boundary of a first opening of a first sub-pixel and a boundary of a second opening of a second sub-pixel adjacent to the first sub-pixel in the first direction is not equal to a minimum distance in the second direction between a boundary of a first opening of a first sub-pixel and a boundary of a second opening of a second sub-pixel adjacent to the first sub-pixel in the second direction.

6. The display substrate according to claim 1, wherein an outline of the pattern of the orthographic projection of the first opening of the first sub-pixel on the base substrate and/or an outline of the pattern of the orthographic projection of the second opening of the second sub-pixel on the base substrate comprise/comprises an arc, and the pattern of the orthographic projection of the first opening of the first sub-pixel on the base substrate and/or the pattern of the orthographic projection of the second opening of the second sub-pixel on the base substrate are/is axisymmetric in one of the first direction and the second direction, and are/is non-axisymmetric in the other of the first direction and the second direction.

7. The display substrate according to claim 1, wherein an outline of the pattern of the orthographic projection of the first opening of the first sub-pixel on the base substrate and/or an outline of the pattern of the orthographic projection of the second opening of the second sub-pixel on the base substrate comprise/comprises an arc portion and a non-arc portion, the arc portion has a same center of circle, and a total length of the non-arc portion is less than a total length of the arc portion.

8. The display substrate according to claim 1, wherein the first opening of at least one first sub-pixel comprises a body portion and an auxiliary portion, an orthographic projection of the body portion of the first opening on the base substrate is substantially a circle, and an orthographic projection of the auxiliary portion of the first opening on the base substrate protrudes in the first direction or in the second direction relative to the circle.

9. The display substrate according to claim 8, wherein a pattern of the orthographic projection of the body portion of the first opening on the base substrate has a first center of circle, and wherein for the first opening having the first center, the first center of the first opening is offset by a first offset distance in the first direction or the second direction relative to the first center of circle of the body portion of the first opening.

10. The display substrate according to claim 9, wherein for the first opening having the third center, the third center of the first opening is offset by a second offset distance in the first direction or the second direction relative to the first center of circle of the body portion of the first opening.

11. The display substrate according to claim 10, wherein a ratio of the first offset distance to the second offset distance ranges from 0.8 to 1.2, and wherein the first offset distance and/or the second offset distance range/ranges from 1 micron to 5 microns.

12. The display substrate according to claim 9, wherein a line connecting the first center of circle of the first opening and the second center is substantially parallel to the first direction, a line connecting the first center and the second center forms a first angle with respect to the first direction, and the first angle is greater than or equal to 0° and less than or equal to 30°; and/or for the first opening having the third center, a line connecting the first center of circle of the first opening and the fourth center is substantially parallel to the first direction, a line connecting the third center and the fourth center forms a second angle with respect to the first direction, and the second angle is greater than or equal to 0° and less than or equal to 30°.

13. The display substrate according to claim 1, wherein at least one first pixel structure further comprises at least four third sub-pixels, the pixel defining layer comprises a plurality of third openings in the first display region, and the third sub-pixel comprises the third opening, and wherein an orthographic projection of at least one third opening on the base substrate falls within the first quadrilateral and has a fifth center, and a separation distance between the fifth center and the second center in the second direction is not equal to a separation distance between the fifth center and the third center in the second direction.

14. The display substrate according to claim 13, wherein the third opening of at least one third sub-pixel comprises a body portion and an auxiliary portion, an orthographic projection of the body portion of the third opening on the base substrate is a circle, and an orthographic projection of the auxiliary portion of the third opening on the base substrate protrudes in the second direction relative to the circle of the body portion of the third opening.

15. The display substrate according to claim 13, wherein in the first pixel structure, patterns of orthographic projections of the third openings of the four third sub-pixels on the base substrate have the fifth center, a sixth center, a seventh center and an eighth center, respectively, and the fifth center, the sixth center, the seventh center and the eighth center are connected in sequence to form a second quadrilateral, and a ratio of a length of one of any two sides among four sides of the second quadrilateral to a length of the other of the two sides ranges from 0.8 to 1.2.

16. The display substrate according to claim 13, wherein the display substrate further comprises:

an anode structure on a side of the pixel defining layer facing the base substrate;

a pixel driving circuit between the base substrate and the anode structure; and an anode connection hole, wherein the anode structure is connected to the pixel driving circuit through the anode connection hole, wherein an orthographic projection of an auxiliary portion of the first opening on the base substrate protrudes, relative to a circle of a body portion of the first opening, toward an orthographic projection of the anode connection hole of the first sub-pixel where the first opening is located on the base substrate; and/or an orthographic projection of an auxiliary portion of the third opening on the base substrate protrudes, relative to a circle of a body portion of the third opening, toward an orthographic projection of the anode connection hole of the third sub-pixel where the third opening is located on the base substrate, and wherein the auxiliary portion of the first opening has a first corner portion on a side facing the anode connection hole of the first sub-pixel; and/or the auxiliary portion of the third opening has a third corner portion on a side facing the anode connection hole of the third sub-pixel, and in the first pixel structure, at least two first corner portions have different orientations and/or at least two third corner portions have different orientations, and wherein an orthographic projection of the body portion of the first opening on the base substrate comprises a first arc, an orthographic projection of the first corner portion on the base substrate comprises a first side and a second side, the first side and the second side are respectively connected to the first arc and tangent to the first arc at respective connecting points, and an angle formed between the first side and the second side ranges from 10° to 170°; and/or wherein an orthographic projection of the body portion of the third opening on the base substrate comprises a third arc, an orthographic projection of the third corner portion on the base substrate comprises a first side and a second side, the first side of the third corner portion and the second side of the third corner portion are respectively connected to the third arc and tangent to the third arc at respective connecting points, and an angle formed between the first side of the third corner portion and the second side of the third corner portion ranges from 10° to 170°, and wherein the first opening has a first outline with a first boundary portion, a distance between the first boundary portion and the first center of circle of the body portion of the first opening is greater than a distance between other parts of the first outline and the first center of circle of the body portion of the first opening, and a distance between the first boundary portion and a center of the anode connection hole of the first sub-pixel where the first opening is located is less than a distance between other parts of the first outline and the center of the anode connection hole of the first sub-pixel where the first opening is located; and/or wherein the third opening has a third outline with a third boundary portion, a distance between the third boundary portion and a third center of circle of the body portion of the third opening is greater than a distance between other parts of the third outline and the third center of circle of the body portion of the third opening, and a distance between the third boundary portion and a center of the anode connection hole of the third sub-pixel where the third opening is located is less than a distance between other parts of the third outline and the center of the anode connection hole of the third sub-pixel where the third opening is located.

17. The display substrate according to claim 1, wherein the display substrate comprises a plurality of first pixel structures arranged on the base substrate in an array in a first direction and a second direction to form sub-pixel rows and sub-pixel columns, and wherein a line connecting centers of first openings of a plurality of first sub-pixels in a same sub-pixel row and centers of second openings of a plurality of second sub-pixels in the same sub-pixel row is a broken line comprising a plurality of line segments, at least one line segment forms a third angle with respect to the first direction, and the third angle is greater than 0° and less than or equal to 30°; and/or a line connecting centers of first openings of a plurality of first sub-pixels in a same sub-pixel column and centers of second openings of a plurality of second sub-pixels in the same sub-pixel column is a broken line comprising a plurality of line segments, at least one line segment forms a fourth angle with respect to the second direction, and the fourth angle is greater than 0° and less than or equal to 30°.

18. The display substrate according to claim 1, wherein for two third openings adjacent in a first direction in the first pixel structure, a deflection direction of a third axis of symmetry of one third opening relative to a second direction is opposite to a deflection direction of a third axis of symmetry of the other third opening relative to the second direction; and/or wherein for two third openings adjacent in a second direction in the first pixel structure, a deflection direction of a third axis of symmetry of one third opening relative to the second direction is opposite to a deflection direction of a third axis of symmetry of the other third opening relative to the second direction, and wherein for the two third openings adjacent in the first direction in the first pixel structure, a deflection angle of the third axis of symmetry of one third opening relative to the second direction is substantially equal to a deflection angle of the third axis of symmetry of the other third opening relative to the second direction; and/or wherein for the two third openings adjacent in the second direction in the first pixel structure, a deflection angle of the third axis of symmetry of one third opening relative to the second direction is substantially equal to a deflection angle of the third axis of symmetry of the other third opening relative to the second direction, and wherein the first opening of at least one first sub-pixel comprises a body portion and an auxiliary portion, an orthographic projection of the body portion of the first opening on the base substrate is a major circle, and an orthographic projection of the auxiliary portion of the first opening on the base substrate protrudes in a second direction relative to the major circle, and wherein a third opening of at least one third sub-pixel comprises a body portion and an auxiliary portion, an orthographic projection of the body portion of the third opening on the base substrate is a major circle, and an orthographic projection of the auxiliary portion of the third opening on the base substrate protrudes in the second direction relative to the major circle, and/or wherein the orthographic projection of the second opening of at least one second sub-pixel on the base substrate is a major circle.

19. The display substrate according to claim 1, wherein an outline of the orthographic projection of the second opening of at least one second sub-pixel on the base substrate comprises a second major arc and a second chord, and the second chord and an anode connection hole of the second sub-pixel where the second opening is located are respectively located on opposite sides of the second major arc; or wherein an outline of the orthographic projection of the second opening of at least one second sub-pixel on the base substrate comprises a second major arc and a second chord, and the second chord and an anode connection hole of the second sub-pixel where the second opening is located are located on a same side of the second major arc.

20. A display device, comprising the display substrate according to claim 1.

* * * * *